US009812631B2

(12) United States Patent
Ebigase et al.

(10) Patent No.: US 9,812,631 B2
(45) Date of Patent: Nov. 7, 2017

(54) PIEZOELECTRIC/ELECTROSTRICTIVE ACTUATOR

(71) Applicants: NGK Insulators, Ltd., Nagoya-Shi (JP); NGK Ceramic Device Co., Ltd., Komaki-Shi (JP)

(72) Inventors: Takashi Ebigase, Nagoya (JP); Koji Katsu, Tajimi (JP)

(73) Assignees: NGK Insulators, Ltd., Nagoya (JP); NGK Ceramic Device Co., Ltd., Komaki-Shi (JP)

( * ) Notice: Subject to any disclaimer, the term of this patent is extended or adjusted under 35 U.S.C. 154(b) by 909 days.

(21) Appl. No.: 14/211,824

(22) Filed: Mar. 14, 2014

(65) Prior Publication Data
US 2016/0380177 A1 Dec. 29, 2016

Related U.S. Application Data

(63) Continuation of application No. PCT/JP2012/073822, filed on Sep. 18, 2012.

(30) Foreign Application Priority Data

Sep. 22, 2011 (JP) .................................. 2011-206898
Mar. 15, 2012 (JP) .................................. 2012-058887

(51) Int. Cl.
*H01L 41/053* (2006.01)
*H01L 41/09* (2006.01)
(Continued)

(52) U.S. Cl.
CPC ............ *H01L 41/09* (2013.01); *H01L 41/047* (2013.01); *H01L 41/0533* (2013.01);
(Continued)

(58) Field of Classification Search
CPC ... H01L 41/09; H01L 41/047; H01L 41/0533; H01L 41/0973; H01L 41/183; H01L 41/23
(Continued)

(56) References Cited

U.S. PATENT DOCUMENTS 6,109,736 A 8/2000 Miyata et al.
8,575,822 B2 * 11/2013 Ebigase ............... B41J 2/14032
310/324
(Continued)

FOREIGN PATENT DOCUMENTS

JP 02-164081 A1 6/1990
JP 10-305578 A1 11/1998
(Continued)

OTHER PUBLICATIONS

International Search Report and Written Opinion dated Dec. 4, 2012.
(Continued)

*Primary Examiner* — Thomas Dougherty
(74) *Attorney, Agent, or Firm* — Burr & Brown, PLLC

(57) ABSTRACT

A piezoelectric/electrostrictive ("PE") actuator includes a PE element including a laminated object having a PE layer and a pair of electrodes arranged respectively on both sides of the PE layer, and having an operating part corresponding to the portion in which the PE layer is sandwiched between the pair of electrodes and a non-operating part corresponding to the portion in which the PE layer is not sandwiched between the pair of electrodes, and a moisture-proof film covering at least the vicinity of a boundary between the operating part and the non-operating part, consisting of a liquid with a saturated moisture content at 25 degree Celsius of 300 ppm or less and a withstand voltage at the saturated moisture content of not less than 6 kV/mm. The liquid
(Continued)

contains hydrocarbon system organic compound having a main backbone of carbon-carbon bond and consisting only of carbon and hydrogen.

16 Claims, 8 Drawing Sheets

(51) Int. Cl.
    *H01L 41/23*     (2013.01)
    *H01L 41/047*     (2006.01)
    *H01L 41/18*     (2006.01)
    *H01L 41/187*     (2006.01)

(52) U.S. Cl.
    CPC ........ *H01L 41/0973* (2013.01); *H01L 41/183* (2013.01); *H01L 41/23* (2013.01); *H01L 41/1876* (2013.01)

(58) Field of Classification Search
    USPC .................................. 310/324, 340, 344, 348
    See application file for complete search history.

(56) References Cited

U.S. PATENT DOCUMENTS

| | | |
|---|---|---|
| 2009/0085443 A1 | 4/2009 | Hishinuma et al. |
| 2010/0097431 A1 | 4/2010 | Takakuwa |
| 2012/0062071 A1 | 3/2012 | Ebigase |

FOREIGN PATENT DOCUMENTS

| | | |
|---|---|---|
| JP | 2000-211129 A1 | 8/2000 |
| JP | 2000-270568 A1 | 9/2000 |
| JP | 2003-062999 A1 | 3/2003 |
| JP | 2003-347621 A1 | 12/2003 |
| JP | 2006-114615 A1 | 4/2006 |
| JP | 2009-081347 A1 | 4/2009 |
| JP | 2010-118641 A1 | 5/2010 |
| JP | 2010-188639 A1 | 9/2010 |
| JP | 2012-043844 A1 | 3/2012 |

OTHER PUBLICATIONS

Japanese Office Action (Application No. 2013-534714) dated Jul. 5, 2016.

Extended European Search Report (Application No. 12833858.9) dated Jul. 6, 2015.

\* cited by examiner (a)

(b)

(c)

(a)

(b)

(c)

PIEZOELECTRIC/ELECTROSTRICTIVE ACTUATOR

FIELD OF THE INVENTION

The present invention relates to a piezoelectric/electrostrictive actuator. In more detail, the present invention relates to a piezoelectric/electrostrictive actuator with suppressed inhibition of a piezoelectric displacement and improved insulation durability under high humidity atmosphere.

BACKGROUND OF THE INVENTION

A piezoelectric/electrostrictive actuator has an advantage that its displacement can be precisely controlled in a submicron order. Especially, a piezoelectric/electrostrictive actuator using a sintered object of piezoelectric/electrostrictive porcelain composite as a piezoelectric/electrostrictive object has a further advantage that its electromechanical transduction efficiency is high, its generated force is large, its response speed is quick, durability is high, and its power consumption is low, in addition to the advantage that a displacement can be precisely controlled, and is adopted as an ink-jet head and a micro pump, etc. taking advantage of these advantages.

However, in the art, there has been a concern about degradation and an insulation breakdown of a piezoelectric film (piezoelectric object) in high temperature and high humidity conventionally, various measures have been taken in order to suppress such degradation and an insulation breakdown of a piezoelectric film due to water.

For example, patent document 1 (PTL 1) describes that by disposing an electrode with a low rate of moisture vapor transmission rate on a piezoelectric film, and disposing a protective film which consists of inorganic material covering a peripheral part of the electrode and piezoelectric film, invasion of moisture to the piezoelectric film can be prevented.

Moreover, patent document 2 (PTL 2) describes that the thickness of the insulating layer formed only by electrodepositing and baking (electrodeposition coating) acrylic paint etc. on an outer periphery a laminated electrostrictive actuator is insufficient and therefore invasion of moisture from the corner part can be suppressed by performing second electrodeposition coating anew after the electrodeposition coating of the paint.

Further, patent document 3 (PTL 3) describes that by coating a piezoelectric element for ink-jet heads which has a minute crack generated at the time of slicing processing with epoxy adhesive to fill up the minute crack therewith and thereafter drying and hardening the epoxy adhesive, the strength and moisture-proof property thereof can be improved.

Furthermore, patent document 4 (PTL 4) describes that by coating the exposed part of an internal electrode layer and an exterior electrode in laminated type piezoelectric ceramics with silicone, hardening the silicone to form an exterior part, migration of electrode material and a short-circuit can be prevented.

CITATION LIST

Patent Literature

[PTL 1] Japanese Patent Application Laid-Open (kokai) No. 2009-081347

[PTL 2] Japanese Patent Application Laid-Open (kokai) No. 2003-347621

[PTL 3] Japanese Patent Application Laid-Open (kokai) No. 2003-062999

[PTL 4] Japanese Patent Application Laid-Open (kokai) No. 2000-270568

SUMMARY OF THE INVENTION

Technical Problem

As mentioned above, in the art, there has been a concern about a degradation and an insulation breakdown of a piezoelectric film (piezoelectric object) under high temperature and high humidity circumstances conventionally. Although its reliability in practical use has reached a high level as a result of a great deal of hard consideration, such concern has not been yet wiped away completely and has been still recognized as an issue which should still be solved in an acceleration degradation test for quality control, etc. It is a fact that conventional technology has not yet come to find out sufficient solution to problems such as a degradation and an insulation breakdown of a piezoelectric/electrostrictive layer, and a short-circuit of an electrode, etc., largely due to a microcrack (minute crack) produced mainly between an active part (operating part) and an inactive part (non-operating part) and/or in a grain boundary (especially, grain boundary corresponding to a triple point), especially during a polarization treatment or when being driven as a piezoelectric/electrostrictive element. In addition, the details of an active part (operating part), an inactive part (non-operating part), and a grain boundary (especially, grain boundary corresponding to a triple point) will be mentioned later.

Moreover, since the inorganic coating used as a protective film for the purpose of moisture-proof in the above-mentioned patent document 1 is hard and inhibits the displacement of the piezoelectric element, a measure, such as patterning for not covering the active part is required. Actually, also in the above-mentioned patent document 1, it is a constituent feature that a protective film has an opening in a position corresponding to the piezoelectric film except a peripheral part (namely, active part). Performing such patterning complicates a manufacturing process and leads to cost escalation.

Although the above-mentioned patent documents 2 to 4 disclose to use an organic coating as a moisture-proof film on the other hand, moisture-proof property, and therefore high-humidity insulation property, is insufficient. Moreover, the fact remains that even an organic coating inhibits somewhat of the displacement of a piezoelectric element in its hard state after hardening.

The present invention has been accomplished in order to solve such a subject, and its one purpose is to improve insulation durability of a piezoelectric/electrostrictive actuator under high humidity atmosphere while suppressing inhibition of a piezoelectric displacement.

Solution to Problem

The first embodiment of the present invention for solving the subject is, a piezoelectric/electrostrictive actuator which comprises:
a piezoelectric/electrostrictive element comprising at least one laminated object including a piezoelectric/electrostrictive layer and a pair of electrodes arranged respectively on both sides of said piezoelectric/electrostrictive layer, and having an operating part corresponding to the portion in which said piezoelectric/electrostrictive layer is sandwiched in between said pair of electrodes and a non-operating part corresponding to the portion in which said piezoelectric/electrostrictive layer is not sandwiched in between said pair of electrodes, and a moisture-proof film arranged so as to cover at least the vicinity of a boundary between said operating part and said non-operating part, consisting of a liquid with a saturated moisture content at 25 degree Celsius of 300 ppm or less and a withstand voltage at the saturated moisture content of not less than 6 kV/mm, and said liquid contains, as a main component, hydrocarbon system organic compound having a main backbone of carbon-carbon bond and consisting only of carbon and hydrogen.

Moreover, the second embodiment of the present invention is, the piezoelectric/electrostrictive actuator according to the above-mentioned first embodiment of the present invention, wherein:

moisture content of said liquid in a state where said liquid is used as said moisture-proof film is not less than 20 ppm.

Further, the third embodiment of the present invention is, the piezoelectric/electrostrictive actuator according to the above-mentioned first embodiment of the present invention, wherein:

a transfer coefficient of moisture in a liquid boundary film of said liquid under a circumstance of 40 degree Celsius× 85% RH is less than 0.2 cm/Hr.

In addition, the fourth embodiment of the present invention is, the piezoelectric/electrostrictive actuator according to the above-mentioned third embodiment of the present invention, wherein:

paraffin carbon rate (% CP), naphthene carbon rate (% CN), and aromatic carbon rate (% CA) obtained by the n-d-M method satisfy the relation expressed by the following formula (1).

[Formula 1]

$$20\% \leq \frac{\% \ CN}{\% \ CP + \% \ CN} < 40\%, \% \ CA < 2\% \quad (1)$$

Moreover, the fifth embodiment of the present invention is, the piezoelectric/electrostrictive actuator according to the above-mentioned fourth embodiment of the present invention, wherein:

sulfur content is less than 100 ppm.

Further, the sixth embodiment of the present invention is, the piezoelectric/electrostrictive actuator according to any one of the above-mentioned first to fifth embodiments of the present invention, wherein:

said liquid further comprises less than 5 mass % of a gelling agent.

Furthermore, the seventh embodiment of the present invention is, the piezoelectric/electrostrictive actuator according to the above-mentioned sixth embodiment of the present invention, wherein:

said gelling agent is a gelling agent originating in vegetable oil.

In addition, the eighth embodiment of the present invention is, the piezoelectric/electrostrictive actuator according to any one of the above-mentioned first to seventh embodiments of the present invention, wherein:

said piezoelectric/electrostrictive element is arranged on a substrate.

Moreover, the ninth embodiment of the present invention is, the piezoelectric/electrostrictive actuator according to the above-mentioned eighth embodiment of the present invention, wherein:

said substrate has a thin-walled part, and said piezoelectric/electrostrictive element is arranged so as to cover at least one portion of the thin-walled part.

Further, the tenth embodiment of the present invention is, the piezoelectric/electrostrictive actuator according to the above-mentioned ninth embodiment of the present invention, wherein:

said piezoelectric/electrostrictive element is fixed to an area corresponding to said thin-walled part on said substrate.

Furthermore, the eleventh embodiment of the present invention is, the piezoelectric/electrostrictive actuator according to any one of the above-mentioned eighth to tenth embodiments of the present invention, wherein:

said piezoelectric/electrostrictive element is fixed to said substrate through said electrode.

In addition, the twelfth embodiment of the present invention is, the piezoelectric/electrostrictive actuator according to any one of the above-mentioned first to eleventh embodiments of the present invention, wherein:

said moisture-proof film is arranged so as to cover the vicinity of a boundary between said operating part and said non-operating part as well as said operating part, said piezoelectric/electrostrictive actuator has a minute crack in the vicinity of a boundary between said operating part and said non-operating part, or in the vicinity of a grain boundary between crystal grains which constitutes the piezoelectric/electrostrictive layer included in said operating part, in said piezoelectric/electrostrictive element, and the crack is filled up with said liquid which constitutes said moisture-proof film.

Moreover, the thirteenth embodiment of the present invention is, the piezoelectric/electrostrictive actuator according to any one of the above-mentioned first to twelfth embodiments of the present invention, wherein:

at least one layer of protective film is further arranged on said moisture-proof film.

Further, the fourteenth embodiment of the present invention is, the piezoelectric/electrostrictive actuator according to the above-mentioned thirteenth embodiment of the present invention, wherein:

at least one layer among said protective films comprises fluorine system organic material.

Furthermore, the fifteenth embodiment of the present invention is, the piezoelectric/electrostrictive actuator according to the above-mentioned thirteenth embodiment of the present invention, wherein:

at least one layer among said protective films is formed by hardening the surface of said moisture-proof film.

In addition, the sixteenth embodiment of the present invention is, the piezoelectric/electrostrictive actuator according to the above-mentioned thirteenth embodiment of the present invention, wherein:

at least one layer among said protective films comprises polyparaxylylene system organic material.

Advantageous Effects of Invention

In accordance with the present invention, a piezoelectric/electrostrictive actuator with suppressed inhibition of a piezoelectric displacement and improved insulation durability under high humidity atmosphere can be provided.

DETAILED DESCRIPTION OF THE INVENTION

The present invention is intended to suppress high-humidity insulation degradations (for example, a degradation and an insulation breakdown of a piezoelectric/electrostrictive layer, a short-circuit of an electrode, etc.) largely due to a microcrack (minute crack) generated mainly in the vicinity of the boundary between an operating part and a non-operating part during a polarization treatment or when being driven as a piezoelectric/electrostrictive element, by disposing a moisture-proof film so as to cover at least the vicinity of the boundary of the operating part and the non-operating part of a portion consisting of a substrate and the piezoelectric/electrostrictive element, in a piezoelectric/electrostrictive actuator which comprises the piezoelectric/electrostrictive element.

In solving such a subject, a conventional technology has attempted to prevent invasion of moisture to a piezoelectric film by applying inorganic coating or organic coating on a specific region of a piezoelectric/electrostrictive actuator and hardening the coating, as disclosed in the above-mentioned prior art literature. However, in a technique according to such a conventional technology, it is difficult to solve simultaneously problems such as a degradation and an insulation breakdown of a piezoelectric/electrostrictive layer, and a short-circuit of an electrode, etc., largely due to a microcrack (minute crack) produced mainly between an active part (operating part) and an inactive part (non-operating part) and/or in a grain boundary (especially, grain boundary corresponding to a triple point), and/or problems such as inhibition of a displacement of a piezoelectric element due to the hardness of a protective film disposed for the purpose of moisture-proof.

Then, as a result of a wholeheartedly research on such a subject, contrary to expectation, the present inventor has found that a high-humidity insulation degradation can be prevented more effectively by using as a moisture-proof film a liquid which has a specific property without hardening the same, and has conceived the present invention. In addition, the above-mentioned "operating part" refers to a part corresponding to a portion in which a piezoelectric/electrostrictive layer is sandwiched in between a pair of electrodes (namely, a portion in which a displacement will be produced when an electric field is applied) in a piezoelectric/electrostrictive element, and the above-mentioned "non-operating part" refers to a part corresponding to a portion in which a piezoelectric/electrostrictive layer is not sandwiched in between a pair of electrodes (namely, a portion in which little or no displacement will be produced when an electric field is applied) in a piezoelectric/electrostrictive element.

Figure 3:
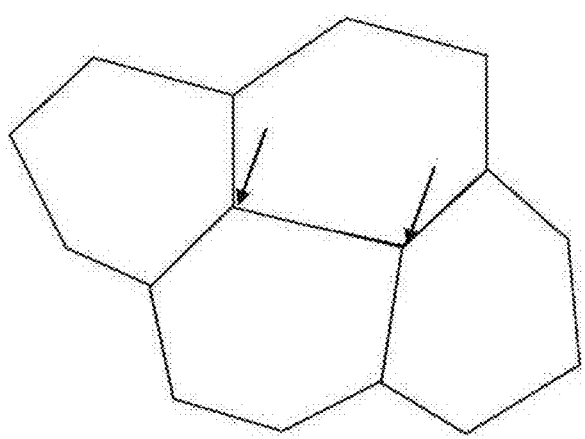
FIG. 3 A schematic diagram showing a grain boundary and a grain boundary triple point of crystal grains which constitute a piezoelectric/electrostrictive layer (piezoelectric object).

Moreover, the above-mentioned "grain boundary" refers to a boundary between a plurality of crystal grains which constitute a piezoelectric/electrostrictive layer (piezoelectric object). Further, the above-mentioned "grain boundary corresponding to a triple point" (hereinafter, may be referred to as a "grain boundary triple point") refers to a point where boundaries of three adjacent crystal grains cross. FIG. 3 is a schematic diagram showing a grain boundary and a grain boundary triple point of crystal grains which constitute a piezoelectric/electrostrictive layer (piezoelectric object) as mentioned above. In FIG. 3, approximate hexagons express crystal grains (ceramic particles) which constitute a piezoelectric object, a boundary of adjacent crystal grains (common side of approximate hexagons) expresses a grain boundary, and a point where three common sides cross (indicated by an arrow in the figure) expresses a grain-boundary triple point.

The First Embodiment

The piezoelectric/electrostrictive actuator according to the first embodiment of the present invention is, a piezoelectric/electrostrictive actuator which comprises:

a piezoelectric/electrostrictive element comprising at least one laminated object including a piezoelectric/electrostrictive layer and a pair of electrodes arranged respectively on both sides of said piezoelectric/electrostrictive layer, and having an operating part corresponding to the portion in which said piezoelectric/electrostrictive layer is sandwiched in between said pair of electrodes and a non-operating part corresponding to the portion in which said piezoelectric/electrostrictive layer is not sandwiched in between said pair of electrodes, and a moisture-proof film arranged so as to cover the vicinity of a boundary between said operating part and said non-operating part, consisting of a liquid with a saturated moisture content at 25 degree Celsius of 300 ppm or less and a withstand voltage at the saturated moisture content of not less than 6 kV/mm, and said liquid contains, as a main component, hydrocarbon system organic compound having a main backbone of carbon-carbon bond and consisting only of carbon and hydrogen.

The piezoelectric/electrostrictive layer can be properly chosen among various piezoelectric/electrostrictive porcelain compositions which are used for manufacturing a piezoelectric/electrostrictive sintered object, including lead zirconate titanate (PZT) system piezoelectric/electrostrictive porcelain compositions and non-lead system piezoelectric/electrostrictive porcelain compositions, development of which has been energetically advanced from a viewpoint of environmental protection in these days. As specific examples, for example, ceramics containing alone, or as a mixture of two or more (preferably three or more) of, lead zirconate, lead titanate, lead magnesium niobate, lead nickel niobate, lead zinc niobate, lead manganese niobate, lead antimony stannate, lead manganese tungstate, lead cobalt niobate, barium titanate, bismuth nickel niobate, sodium bismuth titanate, potassium sodium niobate, strontium bismuth tantalate and etc., can be exemplified. Moreover, the electrodes can be properly chosen from various materials used as an electrode in the art, such as gold (Au), silver (Ag), and platinum (Pt), for example.

In addition, a piezoelectric/electrostrictive layer (may be referred to as a "piezoelectric object") and these electrodes may be laminated through any of techniques well-known in the art (for example, a vapor-phase epitaxial method, or calcination after screen-printing of each of the layers, etc.). Moreover, the thickness of the piezoelectric/electrostrictive layer and/or electrodes can be also properly set in accordance with the use to which a piezoelectric/electrostrictive actuator according to the present invention will be applied.

By the way, the piezoelectric/electrostrictive element may comprise a plurality of the laminated objects. A piezoelectric/electrostrictive element comprising a plurality of the laminated objects can also be manufactured through a technique well-known in the art.

Since it is clear for a person skilled in the art that the piezoelectric/electrostrictive element can be manufactured in various configuration using various techniques known in the art in any of these cases, further detailed explanation is omitted in the present specification.

Regardless of the number of the laminated objects (including a piezoelectric/electrostrictive layer and a pair of electrodes arranged respectively on both sides of said piezoelectric/electrostrictive layer) which the piezoelectric/electrostrictive element comprises, the piezoelectric/electrostrictive element contained in the piezoelectric/electrostrictive actuator according to the present invention has the operating part corresponding to the portion in which the piezoelectric/electrostrictive layer is sandwiched between the pair of electrodes and the non-operating part corresponding to the portion in which the piezoelectric/electrostrictive layer is not sandwiched between the pair of electrodes.

In the piezoelectric/electrostrictive element, the operating part refers to a part corresponding to a portion in which the piezoelectric/electrostrictive layer is sandwiched in between the pair of electrodes, and the operating part is a region in which a deformation (displacement) depending on an applied electric field will be produced when the electric field is applied, in the piezoelectric/electrostrictive element after calcination. On the other hand, the non-operating part refers to a part corresponding to a portion in which a piezoelectric/electrostrictive layer is not sandwiched in between a pair of electrodes, and the non-operating part is a region in which little or no deformation (displacement) depending on an applied electric field will be produced even when the electric field is applied, in the piezoelectric/electrostrictive element after calcination.

Therefore, during a polarization treatment or when being driven as a piezoelectric/electrostrictive element, stress tends to be applied to the vicinity of the boundary between an operating part and a non-operating part to generate a microcrack. This microcrack serves as a main factor which causes problems, such as a degradation and an insulation breakdown of a piezoelectric/electrostrictive layer, and a short-circuit of an electrode, and becomes a factor which reduces the insulation durability of the piezoelectric/electrostrictive element under high-humidity atmosphere.

Moreover, in the piezoelectric/electrostrictive element, a grain boundary refers to a boundary of a plurality of crystal grains which constitute a piezoelectric/electrostrictive layer (piezoelectric object). Further, a grain-boundary triple point refers to a point where boundaries of three adjacent crystal grains cross. In the piezoelectric object, when an electric field is applied, a displacement is revealed by domains in a crystal grain expanding and contracting and rotating. On this occasion, stress concentrates especially at a grain boundary at which the directionality of a domain and/or a crystalline lattice does not match. The triple point of a grain boundary is a spot where stress especially tends to concentrate among such grain boundaries. Therefore, microcrack tends to occur also at the grain boundary (especially, grain-boundary triple point) of the piezoelectric/electrostrictive layer (piezoelectric object) included in the above-mentioned operating part. Even more, in a grain boundary of the piezoelectric/electrostrictive layer (piezoelectric object) included in the vicinity of the boundary between the operating part and the non-operating part, a microcrack is especially likely to occur.

Therefore, approaches to dispose a moisture-proof film in the vicinity of the boundary between an operating part and a non-operating part have been considered conventionally. However, in the present invention, contrary to expectation, it has been found that a high-humidity insulation degradation can be prevented more effectively by using as a moisture-proof film a liquid which has a specific property without hardening the same. Herein, the "liquid which has a specific property" specifically refers to a liquid which has a saturated moisture content at 25 degree Celsius of 300 ppm or less and a withstand voltage at the saturated moisture content of not less than 6 kV/mm and contains, as a main component, hydrocarbon system organic compound having a main backbone of carbon-carbon bond and consisting only of carbon and hydrogen.

The saturated moisture content can be measured by various methods known in the art as a method for measuring the moisture content in a liquid. Specifically, the saturated moisture content can be measured, for example, by measuring the moisture content of a liquid by a Karl Fischer's coulometric titration method after still standing for 24 hours or more under a high-humidity circumstance of not less than 85% of humidity. It is desirable that the saturated moisture content of the liquid thus measured is 300 ppm or less as mentioned above, more preferably 300 ppm or less. When the saturated moisture content exceeds 300 ppm, it is not desirable since a possibility to reduce the insulation durability of a piezoelectric/electrostrictive element under high-humidity atmosphere will increase.

Moreover, the withstand voltage refers to the maximum electric field intensity at which an insulation breakdown of the liquid does not occur in a state where the liquid contains moisture of the quantity equivalent to the saturated moisture content. The withstand voltage can be measured by various methods known in the art as a method for measuring a withstand voltage of various materials. Specifically, the withstand voltage can be measured, for example, by dipping a pair of globular electrodes with a diameter of 12.5 mm at an electrode gap of 2.5 mm into the liquid which serves as a measuring object and increasing the applied voltage between the electrodes at a rate of about 3 kV/second, and measuring the voltage at the time when an insulation breakdown occurs. It is desirable that the withstand voltage of the liquid thus measured is not less than 6 kV/mm as mentioned above, more preferably not less than 8 kV/mm. For example, in a case where it is required that a larger piezoelectric displacement than before should be attained in a smaller piezoelectric/electrostrictive element, etc., when the withstand voltage is less than 6 kV/mm, there is a possibility that it may become difficult to demonstrate a sufficient insulation durability when an electric field higher than before is applied between the electrodes of a piezoelectric/electrostrictive element.

Further, the material of the moisture-proof film in the piezoelectric/electrostrictive actuator according to the present embodiment can be properly chosen from various available liquid materials to be used, as long as it maintains a liquid state in the range of temperature to which the piezoelectric/electrostrictive actuator according to the present embodiment is exposed and the saturated moisture content and withstand voltage fall within the above-mentioned ranges. As such a liquid material, various liquids, such as various solvents, various oils (for example, mineral oil, synthetic oil, etc.), various polymer, can be exemplified, for example. Among these, hydrocarbon system organic compounds which have a carbon-carbon bond as a main backbone and consist only of carbon and hydrogen are widely distributed as petroleum products and can be obtained easily, and are advantageous also in respect of cost since they are cheap. Therefore, in the piezoelectric/electrostrictive actuator according to the present embodiment, it is desirable to use a liquid which contains, as a main component, a hydrocarbon system organic compound having a main backbone of carbon-carbon bond and consisting only of carbon and hydrogen.

Here, the liquid which contains, as a main component, a hydrocarbon system organic compound having a main backbone of carbon-carbon bond and consisting only of carbon and hydrogen refers to liquid wherein material constituting the major part of the liquid is the hydrocarbon system organic compound having a main backbone of carbon-carbon bond and consisting only of carbon and hydrogen. Conversely, unless it has harmful effects in the use as the above-mentioned moisture-proof film in a piezoelectric/electrostrictive actuator, the liquid may contain a small amount of a component other than the hydrocarbon system organic compound having a main backbone of carbon-carbon bond and consisting only of carbon and hydrogen. Moreover, unless it has harmful effects in the use as the above-mentioned moisture-proof film in a piezoelectric/electrostrictive actuator, the hydrocarbon system organic compound may have a substituent other than hydrocarbon in part. Further, unless it has harmful effects in the use as the above-mentioned moisture-proof film in a piezoelectric/electrostrictive actuator, the hydrocarbon system organic compound may include an unsaturated bond (a double bond, a triple bond) and/or a ring structure.

For example, mineral oil can also be used as a material of the moisture-proof film in the piezoelectric/electrostrictive actuator according to the present invention. Although there is some mineral oil in which a component containing sulfur (S), oxygen (O), or nitrogen (N) is contained as an impurity element in a small quantity (for example, about hundreds of ppm), even such a mineral oil including a small amount of a component containing such an impurity element can be used as a material of the moisture-proof film in the piezoelectric/electrostrictive actuator according to the present invention, unless it has harmful effects in the use as the above-mentioned moisture-proof film in a piezoelectric/electrostrictive actuator. Preferably, even in a case where a small amount of a component containing such an impurity element are contained, as a material of the moisture-proof film in the piezoelectric/electrostrictive actuator according to the present invention, it is desirable to use a material in which more than the 99.5 mass % thereof is a liquid which contains, as a main component, hydrocarbon system organic compound having a main backbone of carbon-carbon bond and constituted only by carbon and hydrogen. Conversely, in the material of the moisture-proof film in the piezoelectric/electrostrictive actuator according to the present invention, it is desirable for the content of the component containing such an impurity element to be less than 0.5 mass %. In the material of the moisture-proof film in the piezoelectric/electrostrictive actuator according to the present invention, when the content of the component containing such an impurity element exceeds the 0.5 mass %, it is not preferable since its saturated moisture content becomes high, and/or the insulation breakdown voltage of a piezoelectric/electrostrictive layer falls, or degradation accompanying oxidization of a piezoelectric/electrostrictive layer takes place easily, and therefore the reliability falls, for example.

In addition, it is desirable that the liquid does not contain a component which volatilizes easily. When the liquid contains such as a component which volatilizes easily, in an apparatus using the piezoelectric/electrostrictive actuator according to the present embodiment, it is not desirable since there is a possibility that the volatile component may be condensed, adhere, or be adsorbed at various portions of the apparatus to pollute the portions and may lead to, for example, a bad electrical contact at a terminal for electrical connection. However, in an embodiment where a protective film is further arranged on the above-mentioned moisture-proof film as will be mentioned later, provided that this shall not apply to a case where the protective film can seal the volatile component. In addition, the liquid may contain a small amount (for example, less than 5 mass % based on the total amount of the liquid) of a gelling agent originating in vegetable oil etc., for example, unless it has harmful effects in the use as the above-mentioned moisture-proof film in a piezoelectric/electrostrictive actuator.

In addition, a moisture-proof film consisting of a liquid material which has a saturated moisture content and a withstand voltage falling within the above-mentioned ranges and contains, as a main component, hydrocarbon system organic compound having a main backbone of carbon-carbon bond and consisting only of carbon and hydrogen needs to be arranged so as to cover at least the vicinity of a boundary between the operating part and the non-operating part. This is intended to prevent invasion of moisture into the piezoelectric/electrostrictive element by covering with the moisture-proof film the vicinity of a boundary between the operating part and the non-operating part, where the microcrack which can cause a high-humidity insulation degradation (fall of the insulation of the piezoelectric/electrostrictive element under high-humidity atmosphere) is mainly generated, as mentioned above.

Therefore, as long as the moisture-proof film covers at least the vicinity of a boundary between the operating part and the non-operating part, unless there is any other inconvenience (on manufacturing process etc.), it may cover portions other than at least the vicinity of the boundary between the operating part and the non-operating part among the outer surfaces on the side where the piezoelectric/electrostrictive element is fixed. Specifically, the moisture-proof film may be arranged so that the above-mentioned moisture-proof film may cover the vicinity of the boundary between the above-mentioned operating part and the above-mentioned non-operating part as well as the above-mentioned operating part. In addition, as a region where a microcrack tends to be generated other than such a vicinity of the boundary between the operating part and the non-operating part, as mentioned above, a grain boundary (especially, a grain-boundary triple point) of a piezoelectric/electrostrictive layer (piezoelectric object) can be exemplified. Therefore, more preferably, it is desirable to arrange a moisture-proof film so as to cover a grain boundary (especially, a grain-boundary triple point) of a piezoelectric/electrostrictive layer (piezoelectric object).

It is desirable that the moisture-proof film is coated after the polarization treatment of the piezoelectric/electrostrictive actuator in which the piezoelectric/electrostrictive element is fixed on the substrate. A coating method of the moisture-proof film can be properly chosen from various well-known coating methods, depending on the property (for example, viscosity etc.) of the liquid material which constitutes the moisture-proof film and/or the configuration of the piezoelectric/electrostrictive actuator in which the piezoelectric/electrostrictive element is fixed on the substrate, etc. Specifically, as the coating methods of the moisture-proof film, spin coating, spray coating, coating by a dispenser and/or an ink-jet, screen-printing, stamp printing, etc. can be exemplified. In addition, more preferably, it is desirable to promote filling of the liquid material which constitutes the moisture-proof film into an existing defect (for example, a microcrack etc.) in the piezoelectric/electrostrictive element, for example, through techniques such as vacuuming, when coating the moisture-proof film. More preferably, it is desirable to promote filling of the liquid material which constitutes the moisture-proof film into, for example, a defect (for example, a microcrack etc.), a grain boundary (especially, a grain-boundary triple point), and a crevice between an upper electrode and the piezoelectric/electrostrictive layer, etc. by forming a minute penetration hole in the upper electrode.

In addition, it is desirable that the thickness of the moisture-proof film is in the range of 0.01 to 20 micrometers. When the thickness of the moisture-proof film is thinner than this range, it is not desirable since coating unevenness will occur, it will become difficult to coat a moisture-proof film as a uniform continuous film, and the moisture-proof effect will be spoiled. On the contrary, when the thickness of the moisture-proof film is thicker than this range, it is not desirable since a problem (dripping) that the material of the moisture-proof film overflows out of the target area, etc. may arise at the time of coating of the moisture-proof film, or the moisture contained in the liquid which constitutes the moisture-proof film may separate to produce a waterdrop when temperature falls from high temperature high-humidity circumstance rapidly to low-temperature circumstance, etc. More preferably, it is desirable that the thickness of the moisture-proof film is in the range of 0.02 to 10 micrometers.

The Second Embodiment

Moreover, the piezoelectric/electrostrictive actuator according to the second embodiment of the present invention is, the piezoelectric/electrostrictive actuator according to the above-mentioned first embodiment of the present invention, wherein:

moisture content of said liquid in a state where said liquid is used as said moisture-proof film is not less than 20 ppm.

When the piezoelectric/electrostrictive actuator according to the present invention is not used under a sealed circumstance, a certain amount of moisture invades into the above-mentioned liquid which constitutes the above-mentioned moisture-proof film from ambient circumstance etc. When a liquid difficult to demonstrate sufficient insulation durability is used as a material of the above-mentioned moisture-proof film in such a case, there is a possibility that it may become difficult to prevent more effectively the high-humidity insulation degradation of the piezoelectric/electrostrictive actuator as a result. Therefore, in the piezoelectric/electrostrictive actuator according to the present embodiment, it is desirable to use a liquid which can demonstrate sufficient insulation durability in such a case as a material of the above-mentioned moisture-proof film, as mentioned above. Specifically, it is desirable that the liquid which constitutes the above-mentioned moisture-proof film in the piezoelectric/electrostrictive actuator according to the present embodiment has the withstand voltage of not less than 6 kV/mm at the moisture content of not less than 20 ppm, more preferably not less than 25 ppm.

The Third Embodiment

Further, the piezoelectric/electrostrictive actuator according to the third embodiment of the present invention is, the piezoelectric/electrostrictive actuator according to the above-mentioned first embodiment of the present invention, wherein:

a transfer coefficient of moisture in a liquid boundary film of said liquid under a circumstance of 40 degree Celsius× 85% RH is less than 0.2 cm/Hr.

As mentioned above, in accordance with the piezoelectric/electrostrictive actuator according to the present invention, the insulation durability (high-humidity insulation durability) of the piezoelectric/electrostrictive element under high-humidity atmosphere can be improved, while suppressing inhibition of piezoelectric displacement. However, a use in which it is required to attain still higher high-humidity insulation durability, such as retention of high insulation resistance even after acceleration degradation test under severer conditions, for example, is also assumed. Then, as a result of a wholeheartedly research on such a subject, contrary to expectation, the present inventor has found that still more superior high-humidity insulation durability can be demonstrated, when a transfer coefficient of moisture in a liquid boundary film of the liquid which constitutes a moisture-proof film is less than a predetermined threshold value.

Specifically, as mentioned above, in the piezoelectric/electrostrictive actuator according to the present embodiment, in the above-mentioned liquid which constitutes the moisture-proof film arranged so as to cover the vicinity of at least the boundary of the above-mentioned operating part and the above-mentioned non-operating part, the transfer coefficient of moisture in a liquid boundary film under the circumstance of 40 degree Celsius×85% RH is less than 0.2 cm/Hr. Thereby, in the piezoelectric/electrostrictive actuator according to the present embodiment, the insulation durability (high-humidity insulation durability) of the piezoelectric/electrostrictive element under high-humidity atmosphere can be improved further, while suppressing inhibition of piezoelectric displacement.

In addition, the transfer coefficient can be obtained as follows, for example. On the assumption that the rate of solution when the moisture in an ambient atmosphere with which the liquid contacts dissolves in the liquid is limited by movement of moisture in the liquid boundary film of the liquid, the overall rate equation for the dissolution of water vapor into the solution is expressed by the following formula (2).

[Formula 2]

$$V\frac{dCw}{dt} = Sk_L(Cw_S - Cw) \quad (2)$$

In the formula, V expresses the volume of the liquid, S expresses the gas-liquid interfacial area between the liquid and the ambient atmosphere, Cw expresses the concentration of water dissolved in the liquid, $Cw_S$ expresses the concentration of saturated solution of water dissolved in the liquid, t expresses time, and $k_L$ expresses the transfer coefficient of moisture in a liquid boundary film. Here, the following formula (3) can be obtained by solving the formula (2) under an initial condition where $Cw/Cw_S$=X and X=0 when the time t=0.

[Formula 3]

$$-\ln(1-X) = \frac{S}{V}k_L t \quad (3)$$

Therefore, under a predetermined circumstance (40 degree Celsius×85% RH), the concentration of moisture in the liquid in a state where a predetermined volume (V) of the liquid contacts with its ambient atmosphere through a predetermined surface area (S) is measured, for example, by a detection means, such as a commercial moisture-in-oil meter. The values of −ln (1−X) are computed from such measurement results, and are plotted to time (t). The transfer coefficient ($k_L$) can be obtained from the slope of the plots thus obtained ((S/V)×$k_L$).

The present inventor has found out a correlation between the transfer coefficient (liquid boundary film mass transfer coefficient: $k_L$) of the moisture-proof film obtained as mentioned above and the insulation durability (high-humidity insulation durability) of the piezoelectric/electrostrictive element under high-humidity atmosphere and has specified the range of a transfer coefficient which can attain the outstanding high-humidity insulation durability. Specifically, it is desirable that the moisture-proof film which the piezoelectric/electrostrictive actuator according to the present embodiment comprises has a transfer coefficient of moisture in a liquid boundary film under a circumstance of 40 degree Celsius×85% RH of less than 0.2 cm/Hr, more preferably less than 0.18 cm/Hr. When the transfer coefficient is 0.2 or more cm/Hr, it is not desirable since the possibility of reducing the insulation durability of the piezoelectric/electrostrictive element under high-humidity atmosphere increases.

In addition, as mentioned above, also in the present embodiment, similarly to the above-mentioned first embodiment of the present invention, it is desirable to use, as a liquid constituting the moisture-proof film, a liquid which contains, as a main component, hydrocarbon system organic compound having a main backbone of carbon-carbon bond and consisting only of carbon and hydrogen. Moreover, also about the definition of the liquid which contains, as a main component, hydrocarbon system organic compound having a main backbone of carbon-carbon bond and consisting only of carbon and hydrogen, it is the same as that of the above-mentioned first embodiment of the present invention. Further, although it is desirable that the liquid does not contain a component which volatilizes easily. However, in an embodiment where a protective film is further arranged on the above-mentioned moisture-proof film as will be mentioned later, provided that this shall not apply to a case where the protective film can seal the volatile component. In addition, the liquid may contain a small amount (for example, less than 5 mass % based on the total amount of the liquid) of a gelling agent originating in vegetable oil etc., for example, unless it has harmful effects in the use as the above-mentioned moisture-proof film in a piezoelectric/electrostrictive actuator.

Moreover, also in the present embodiment, similarly to the above-mentioned first embodiment of the present invention, from a viewpoint to prevent invasion of moisture into the piezoelectric/electrostrictive element, as long as the moisture-proof film covers at least the vicinity of a boundary between the operating part and the non-operating part, unless there is any other inconvenience, it may cover portions other than at least the vicinity of the boundary between the operating part and the non-operating part on the outer surfaces on the side where the piezoelectric/electrostrictive element is fixed. Further, it is desirable that the moisture-proof film is coated after the polarization treatment of the piezoelectric/electrostrictive actuator in which the piezoelectric/electrostrictive element is fixed on the substrate and, as a coating method of the moisture-proof film, the same as that of the above-mentioned first embodiment of the present invention can be adopted. In addition, it is also desirable that the thickness of the moisture-proof film is in the range of 0.01 to 20 micrometers, more preferably 0.02 to 10 micrometers, similarly to the above-mentioned first embodiment of the present invention.

The Fourth Embodiment

In addition, the piezoelectric/electrostrictive actuator according to the fourth embodiment of the present invention is, the piezoelectric/electrostrictive actuator according to the above-mentioned third embodiment of the present invention, wherein:

paraffin carbon rate (% CP), naphthene carbon rate (% CN), and aromatic carbon rate (% CA) in said liquid obtained by the n-d-M method satisfy the relation expressed by the following formula (1).

[Formula 4]

$$20\% \le \frac{\% \, CN}{\% \, CP + \% \, CN} < 40\%, \, \% \, CA < 2\% \quad (1)$$

As well-known to a person skilled in the art, the n-d-M method is ring analysis used abundantly in composition analysis of oil, for example, such as lubricating oil, etc., in which a refractive index (n20D), density (d204), a molecular weight, and sulfur content (wt %) are measured, and the number of paraffin carbon, the number of naphthene carbon, and the number of aromatic carbon are expressed as % CP, % CN, and % CA, respectively, which are the rates (percentages) thereof to total carbon.

As mentioned above, in the present embodiment, it is desirable that, as the result of the ring analysis by the n-d-M method, the ratio of the naphthene carbon rate (% CN) to the sum of the paraffin carbon rate (% CP) and the naphthene carbon rate (% CN) in the above-mentioned liquid (naphthene ratio) is not less than 20%, more preferably not less than 21%, and it is less than 40%, more preferably less than 39%. When the naphthene ratio deviates from the range, it is not desirable since the above-mentioned transfer coefficient will increase and the possibility of reducing the insulation durability of the piezoelectric/electrostrictive element under high-humidity atmosphere will increase as a result. Moreover, it is desirable that the aromatic carbon rate (% CA) is less than 2%, as mentioned above, more preferably less than 1.8%. When the aromatic carbon rate (% CA) is not less than 2%, it is not desirable since the above-mentioned transfer coefficient will also increase and the possibility of reducing the insulation durability of the piezoelectric/electrostrictive element under high-humidity atmosphere will also increase as a result.

The Fifth Embodiment

Moreover, the piezoelectric/electrostrictive actuator according to the fifth embodiment of the present invention is,
the piezoelectric/electrostrictive actuator according to the above-mentioned fourth embodiment of the present invention, wherein:
sulfur content in said liquid is less than 100 ppm.
As mentioned above, in the piezoelectric/electrostrictive actuator according to the present embodiment, the content of the sulfur in the above-mentioned liquid is less than 100 ppm. When the content of the sulfur in the above-mentioned liquid is not less than 100 ppm, it is not desirable since the above-mentioned transfer coefficient will increase. On the other hand, since improvement in oxidation stability, etc. can be attained by containing a small amount of sulfur in the above-mentioned liquid, the above-mentioned liquid may contain a small amount of sulfur unless it leads to large increase of the transfer coefficient.

The Sixth Embodiment

Further, the piezoelectric/electrostrictive actuator according to the sixth embodiment of the present invention is,
the piezoelectric/electrostrictive actuator according to any one of the above-mentioned first to fifth embodiments of the present invention, wherein:
said liquid further comprises less than 5 mass % of a gelling agent.

As mentioned above, in the piezoelectric/electrostrictive actuator according to the present embodiment, the above-mentioned liquid further comprises less than 5 mass % of a gelling agent. Thereby, for example, a problem (dripping) that the material of the moisture-proof film overflows out of the target area, etc. can be suppressed. However, when a gelling agent is added excessively (namely, more than 5 mass %), the flowability of the liquid will become insufficient. As a result, there will be possibilities that the function to prevent invasion of moisture into a piezoelectric/electrostrictive element may fall, or it becomes difficult to fill the material of the moisture-proof film into a microcrack (minute crack) which becomes a main factor of a high-humidity insulation degradation (will be mentioned later in detail), and therefore it is not desirable.

The Seventh Embodiment

Furthermore, the piezoelectric/electrostrictive actuator according to the seventh embodiment of the present invention is,
the piezoelectric/electrostrictive actuator according to the above-mentioned sixth embodiment of the present invention, wherein:
said gelling agent is a gelling agent originating in vegetable oil.
As mentioned above, in the piezoelectric/electrostrictive actuator according to the present embodiment, the above-mentioned gelling agent is a gelling agent originating in vegetable oil. Many of the gelling agents originating in vegetable oil have a carbon-carbon bond as a main backbone and consist only of carbon and hydrogen fundamentally. In addition to the above, they are widely distributed in the art and can be obtained easily, and are advantageous also in respect of cost since they are cheap.

The Eighth Embodiment

In addition, the piezoelectric/electrostrictive actuator according to the eighth embodiment of the present invention is,
the piezoelectric/electrostrictive actuator according to any one of the above-mentioned first to seventh embodiments of the present invention, wherein:
said piezoelectric/electrostrictive element is arranged on a substrate.
The substrate is generally used as a substrate for piezoelectric/electrostrictive actuators, and can be manufactured using a material such as zirconium dioxide ($ZrO_2$), silicon oxide ($SiO_2$), aluminum oxide ($Al_2O_3$), etc. Moreover, in the substrate, a small amount of additive agents, for example, yttrium oxide ($Y_2O_3$), titanium oxide ($TiO_2$), etc. may be contained. Furthermore, as a production method of the substrate, well-known techniques in the art (for example, green sheet forming etc.) can be used. In addition, the thickness and shape of the substrate can be properly designed depending on the use to which the piezoelectric/electrostrictive actuator according to the present embodiment is intended to be applied.

The Ninth Embodiment

Moreover, the piezoelectric/electrostrictive actuator according to the ninth embodiment of the present invention is, the piezoelectric/electrostrictive actuator according to the above-mentioned eighth embodiment of the present invention, wherein:

said substrate has a thin-walled part, and said piezoelectric/electrostrictive element is arranged so as to cover at least one portion of the thin-walled part.

As mentioned above, in the piezoelectric/electrostrictive actuator according to the present embodiment, the above-mentioned substrate has a thin-walled part, and the above-mentioned piezoelectric/electrostrictive actuator element is arranged so as to cover at least one portion of the thin-walled part. This thin-walled part can also be formed through techniques generally used in a substrate for piezoelectric/for electrostrictive actuators. For example, the thin-walled part may be formed by cutting a substrate through techniques, such as etching, etc., or may be formed by laminating a relatively thick member (thick-walled part) processed so that it might have an opening at the spot corresponding to the thin-walled part onto a relatively thin member (for example, with a thickness of several micrometers) which in intended to form the thin-walled part.

Namely, regardless of whether it is an integrated type or a laminated type, on the side of the above-mentioned thin-walled part, on which the piezoelectric/electrostrictive element is fixed, a pace whose certain surface (for example, upper surface) contacts with the thin-walled part and another surface intersects with the certain surface (for example, side surface) contacts with the inner wall of the opening of the thick-walled part will exist. In addition, the thickness of the substrate and the thickness and area of the thin-walled part in the substrate, and the volume of the opening of the thick-walled part (thickness of the thick-walled part) can be also designed depending on the use to which the piezoelectric/electrostrictive actuator according to the present embodiment is intended to be applied.

For example, when the piezoelectric/electrostrictive actuator according to the present embodiment is used as a liquid injection head, such as an ink-jet head used in an ink-jet printer, a mechanism (for example, an injection nozzle etc.) for injecting liquid, such as ink, can be disposed so as to be connected with the opening side (side which is not in contact with the thin-walled part and the inner wall of the thick-walled part) of the space. As the configuration of such an injection mechanism, configurations generally used in the technical field of liquid injection heads can be adopted The Tenth Embodiment Further, the piezoelectric/electrostrictive actuator according to the tenth embodiment of the present invention is, the piezoelectric/electrostrictive actuator according to the above-mentioned ninth embodiment of the present invention, wherein:

said piezoelectric/electrostrictive element is fixed to an area corresponding to said thin-walled part on said substrate.

In other words, in the piezoelectric/electrostrictive actuator according to the present embodiment, the above-mentioned piezoelectric/electrostrictive element is fixed to an area corresponding to the thin-walled part on the side opposite to the above-mentioned space (opening of the thick-walled part) of the above-mentioned substrate. The piezoelectric/electrostrictive element comprises at least one laminated object containing a piezoelectric/electrostrictive layer and a pair of electrodes arranged on both sides of the above-mentioned piezoelectric/electrostrictive layer, respectively.

The Eleventh Embodiment

Furthermore, the piezoelectric/electrostrictive actuator according to the eleventh embodiment of the present invention is, the piezoelectric/electrostrictive actuator according to any one of the above-mentioned eighth to tenth embodiments of the present invention, wherein:

said piezoelectric/electrostrictive element is fixed to said substrate through said electrode.

Namely, in the piezoelectric/electrostrictive actuator according to the present embodiment, the electrode nearest to the above-mentioned substrate among the electrodes which constitute the above-mentioned piezoelectric/electrostrictive element is fixed directly to the above-mentioned substrate without involving the above-mentioned piezoelectric/electrostrictive layer. By such a configuration, the size in the thickness direction of the above-mentioned substrate can be made smaller (thinner) in the piezoelectric/electrostrictive actuator according to the present embodiment, for example. Moreover, such a configuration is useful in a use which is intended to attain larger piezoelectric displacement in a smaller piezoelectric/electrostrictive actuator since there is a fewer portion which does not contribute to piezoelectric displacement as compared with a configuration in which the electrode nearest to the above-mentioned substrate is fixed to the above-mentioned substrate through the above-mentioned piezoelectric/electrostrictive layer (Namely, the above-mentioned piezoelectric/electrostrictive layer intervene between the electrode nearest to the above-mentioned substrate and the above-mentioned substrate).

The Twelfth Embodiment

In addition, the piezoelectric/electrostrictive actuator according to the twelfth embodiment of the present invention is, the piezoelectric/electrostrictive actuator according to any one of the above-mentioned first to eleventh embodiments of the present invention, wherein:

said moisture-proof film is arranged so as to cover the vicinity of a boundary between said operating part and said non-operating part as well as said operating part, said piezoelectric/electrostrictive actuator has a minute crack in the vicinity of a boundary between said operating part and said non-operating part, or in the vicinity of a grain boundary between crystal grains which constitutes the piezoelectric/electrostrictive layer included in said operating part, in said piezoelectric/electrostrictive element, and the crack is filled up with said liquid which constitutes said moisture-proof film.

As mentioned above, a microcrack (minute crack) which becomes a main factor of a high-humidity insulation degradation tends to be generated in the vicinity of a boundary between the operating part and the non-operating part, or in the vicinity of a grain boundary between crystal grains which constitutes the piezoelectric/electrostrictive layer included in the above-mentioned operating part, during a polarization treatment of the piezoelectric/electrostrictive element which has the operating part and the non-operating part or when being driven as a piezoelectric/electrostrictive element. Therefore, as mentioned above, by coating a moisture-proof film so as to cover the vicinity of a boundary between the above-mentioned operating part and the above-mentioned non-operating part as well as the above-mentioned operating part and filling the liquid material which constitutes the moisture-proof film into the microcrack, invasion of moisture through the microcrack generated during a polarization treatment can be suppressed effectively.

Although the above-mentioned liquid material can be filled into the microcrack by what is called "capillary action" that naturally occurs when coating the above-mentioned liquid material in many cases, depending on the properties (for example, viscosity etc.) of the above-mentioned liquid material and/or the size and shape of the microcrack, the above-mentioned liquid material may not be filled into the microcrack in some cases. In this case, filling of the above-mentioned liquid material into the microcrack may be promoted, for example, by methods, such as vacuuming, etc.

In addition, the microcrack may be generated not only during a polarization treatment of the piezoelectric/electrostrictive element, but also when being driven as a piezoelectric/electrostrictive element. However, after the polarization treatment of the piezoelectric/electrostrictive element, the moisture-proof film has been coated so as to cover the vicinity of a boundary between the above-mentioned operating part and the above-mentioned non-operating part as well as the above-mentioned operating part, as mentioned above. Therefore, even if a new microcrack is generated in the vicinity of a boundary between the operating part and the non-operating part, or in the vicinity of a grain boundary between crystal grains which constitutes the piezoelectric/electrostrictive layer included in the above-mentioned operating part when being driven as a piezoelectric/electrostrictive element thereafter, the above-mentioned liquid material constituting the moisture-proof film can invade into the newly generated microcrack immediately to suppress the high-humidity insulation degradation due to the microcrack since the newly generated microcrack has been covered with the above-mentioned liquid material.

Figure 4:
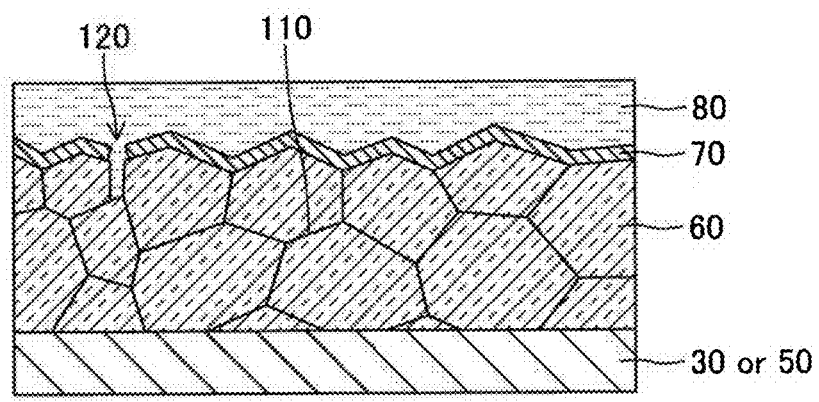
FIG. 4 A schematic diagram showing an appearance that a crack produced at the grain boundary of crystal grains which constitute a piezoelectric/electrostrictive layer (piezoelectric object) is filled up with liquid material which constitutes a moisture-proof film.

As mentioned above, FIG. 4 is a schematic diagram showing an appearance that a crack produced at the grain boundary of crystal grains which constitute a piezoelectric/electrostrictive layer (piezoelectric object) is filled up with liquid material which constitutes a moisture-proof film. As shown in FIG. 4, in the piezoelectric/electrostrictive actuator according to the present embodiment, the crack 120 has been produced in a portion of grain boundaries 110 between the crystal grains which constitute the piezoelectric/electrostrictive layer 60 included in the vicinity of the boundary between the operating part and the non-operating part or the operating part in the piezoelectric/electrostrictive element, as well as, in the upper electrode 70. In the piezoelectric/electrostrictive actuator according to the present embodiment, the moisture-proof film 80 is arranged so that it may cover the vicinity of the boundary between the operating part and the non-operating part as well as the operating part. Thereby, since the crack 120 has been filled up with the above-mentioned liquid constituting the moisture-proof film 80, invasion of moisture into the piezoelectric/electrostrictive layer (piezoelectric object) through the crack 120 can be suppressed effectively. As a result, the high-humidity insulation degradation of the piezoelectric/electrostrictive layer (piezoelectric object) due to the crack 120 can be suppressed effectively.

The Thirteenth Embodiment

Moreover, the piezoelectric/electrostrictive actuator according to the thirteenth embodiment of the present invention is, the piezoelectric/electrostrictive actuator according to any one of the above-mentioned first to twelfth embodiments of the present invention, wherein:

at least one layer of protective film is further arranged on said moisture-proof film.

In the piezoelectric/electrostrictive actuator according to the present embodiment, "on a moisture-proof film" refers to the side opposite to the piezoelectric/electrostrictive element of the moisture-proof film, as a matter of course. It is desirable that the protective film comprises a material which neither is mixed nor reacts with the above-mentioned liquid material which constitutes the above-mentioned moisture-proof film, as a matter of course. More preferably, it is desirable that the above-mentioned protective film comprises a material which can further improve the moisture-proof performance of the piezoelectric/electrostrictive actuator according to the present embodiment by being coated further on the above-mentioned moisture-proof film. As a material which constitutes the above-mentioned protective film, for example, fluororesin, which dissolves in a fluorine system solvent and can form film after being dried, etc. can be exemplified.

By the way, as mentioned above, the moisture-proof film in the piezoelectric/electrostrictive actuator according to the present invention consists of a liquid material. Since a liquid material has flowability, problems in handling, such that the moisture-proof film contacts with other member to adhere to the member, or the moisture-proof film flows to go off a predetermined position due to the slope of the piezoelectric/electrostrictive actuator, etc. when the piezoelectric/electrostrictive actuator is about to be incorporated into a target device, for example, such as a liquid injection head (specifically, an ink-jet head etc.), and/or problems in long-term durability, such that the above-mentioned liquid material which constitutes a moisture-proof film evaporates gradually in association with long-term use of the piezoelectric/electrostrictive actuator to reduce the function as a moisture-proof film are assumed.

Therefore, in order to solve the problems as mentioned above, the piezoelectric/electrostrictive actuator according to the present embodiment wherein at least one layer of protective film is further arranged on the moisture-proof film is suitable. Preferably, it is desirable that the protective film has Young's modulus of 1 MPa or more. Thus, problems in handling and problems in long-term durability as mentioned above, which are assumed in the piezoelectric/electrostrictive actuator according to the present invention, are solved.

Young's modulus of the protective film can be measured, for example, by the method set forth in JIS K 7127. When Young's modulus of the protective film is less than 1 MPa, it is not desirable since especially the above-mentioned problem in handling is not fully solved. More preferably, it is desirable that Young's modulus of the protective film is 10 MPa or more.

In addition, even if a protective film with a relatively high elastic modulus (hard) is coated, unlike the case where a moisture-proof film with a high elastic modulus (hard) is coated, the problem of inhibition of piezoelectric displacement does not occur. It is thought that this is because the operating part of a piezoelectric/electrostrictive element is unlikely to be affected by the influence by the protective film (inhibition of piezoelectric displacement) since the protective film (consisting of liquids, as mentioned above) is coated on the moisture-proof film and the protective film with a high elastic modulus is not directly in contact with the operating part, and therefore the piezoelectric displacement produced in the operating part is relieved/absorbed in the moisture-proof film.

A coating method of the protective film can properly chosen from various well-known coating methods depending on the properties (for example, viscosity etc.) of the liquid material which constitutes the protective film and/or the configuration of the piezoelectric/electrostrictive actuator in which the piezoelectric/electrostrictive element is fixed on the substrate, etc. Specifically, as the coating methods of the protective film, spin coating, spray coating, coating by a dispenser and/or an ink-jet, and screen-printing, etc. can be exemplified.

In addition, it is desirable that the thickness of the protective film is in the range of 0.1 to 10 micrometers. When the thickness of the protective film is thinner than this range, it is not desirable since a problem such that it becomes difficult to coat the protective film as a uniform continuous film and the protective film will be perforated, etc. may arise. On the contrary, when the thickness of the protective film is thicker than this range, it is not desirable since a problem (dripping) that the material of the protective film overflows out of the target area, etc. may arise at the time of coating of the protective film, or displacement of the piezoelectric/electrostrictive element may be inhibited (even though the piezoelectric displacement produced in the operating part is relieved/absorbed in the moisture-proof film). More preferably, it is desirable that the thickness of the protective film is in the range of 0.2 to 8 micrometers.

The Fourteenth Embodiment

Further, the piezoelectric/electrostrictive actuator according to the fourteenth embodiment of the present invention is, the piezoelectric/electrostrictive actuator according to the above-mentioned thirteenth embodiment of the present invention, wherein:

at least one layer among said protective films comprises fluorine system organic material.

As mentioned above, it is desirable that the protective film comprises a material which neither is mixed nor reacts with the above-mentioned liquid material which constitutes the above-mentioned moisture-proof film and, more preferably, which can further improve the moisture-proof performance of the piezoelectric/electrostrictive actuator according to the present embodiment by being coated further on the above-mentioned moisture-proof film. As such a material, fluororesin is especially preferred.

The Fifteenth Embodiment

Furthermore, the piezoelectric/electrostrictive actuator according to the fifteenth embodiment of the present invention is, the piezoelectric/electrostrictive actuator according to the above-mentioned thirteenth embodiment of the present invention, wherein:

at least one layer among said protective films is formed by hardening the surface of said moisture-proof film.

In the piezoelectric/electrostrictive actuator according to the fourteenth embodiment of the present invention, at least one layer of the protective film which comprises fluorine system organic material is further disposed on the moisture-proof film. Although the protective film may be disposed by thus coating on the moisture-proof film as a layer separate from the moisture-proof film, the protective film may be formed by hardening the surface of the moisture-proof film.

As a method for thus hardening the surface of the moisture-proof film, for example, methods, such as plasma exposure processing, ultraviolet curing processing, and moisture curing processing, can be exemplified. Moreover, after separating a protective film component (for example, fluororesin) preliminarily mixed or dissolved into the liquid which constitutes the moisture-proof film to the surface of the moisture-proof film by heat-treatment etc., the separated protective film component may be hardened to form a protective film by performing plasma treatment, ultraviolet curing processing, moisture curing processing, etc. on this surface.

In addition, in the piezoelectric/electrostrictive actuators according to the above-mentioned thirteenth to fifteenth embodiments of the present invention wherein the protective film is disposed on the moisture-proof film as mentioned above, the protective film may have a double-layered structure. Specifically, it is possible to use vacuum equipment etc. to laminate a film with a higher moisture-proof effect as the second protective film, after disposing the first protective film on the moisture-proof film of the piezoelectric/electrostrictive actuator according to each of the above-mentioned embodiments. More specifically, the second protective film can be disposed by laminating alumina, glass, or polyparaxylylene, etc. on the first protective film, for example, through a sputtering method and/or a chemical vapor phase epitaxy (CVD: Chemical Vapor Deposition) method etc. When such a second protective film is disposed, it is more preferable since outgas from the moisture-proof film or the first protective film can be prevented.

The Sixteenth Embodiment

In addition, the piezoelectric/electrostrictive actuator according to the sixteenth embodiment of the present invention is, the piezoelectric/electrostrictive actuator according to the above-mentioned thirteenth embodiment of the present invention, wherein:

at least one layer among said protective films comprises polyparaxylylene system organic material.

As mentioned above, in the piezoelectric/electrostrictive actuators according to the embodiments wherein at least one layer of the protective film is disposed further on the moisture-proof film, the second protective film may be laminated on the first protective film disposed on the moisture-proof film. More preferably, it is desirable that the second protective film is a film with a high moisture-proof effect. Such a film with a high moisture-proof effect can be disposed by laminating alumina, glass, polyparaxylylene, etc. on the first protective film using a sputtering method, a CVD method, etc., as mentioned above.

However, as a result of further research, the present inventor has found out that it was also possible to dispose the second protective film directly on the moisture-proof film without involving the first protective film. Specifically, for example, in a case where a protective film which comprises the polyparaxylylene system organic material is intended to be laminated on the moisture-proof film according to the present invention, the protection layer can be directly disposed on the moisture-proof film, without using a solvent with a possibility of causing the dissolution of the moisture-proof film, etc., for example, through techniques, such as a CVD method.

Although the present invention will be explained in more detail by the working examples described hereafter, the technical scope of the present invention is not limited to these examples.

Example 1

Manufacture of Piezoelectric/Electrostrictive Actuator

Manufacture of the piezoelectric/electrostrictive actuator according to Working Examples 1 to 7 of the present invention and Comparative Examples 1 to 9 will be explained below. However, the configuration and the production method, etc, which will be explained below are just exemplifications and no more and the configuration and the production method of the piezoelectric/electrostrictive actuator according to the present invention are not limited thereto.

(1) Manufacture of Piezoelectric/Electrostrictive Actuator

Figure 1:
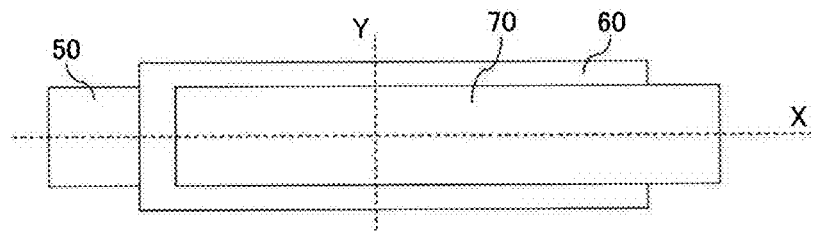
FIG. 1 A plan view (a), a sectional view (b) along the line Y shown in the figure, and a sectional view (c) along the line X shown in the figure, of a piezoelectric/electrostrictive actuator according to one embodiment of the present invention.
Figure 1:
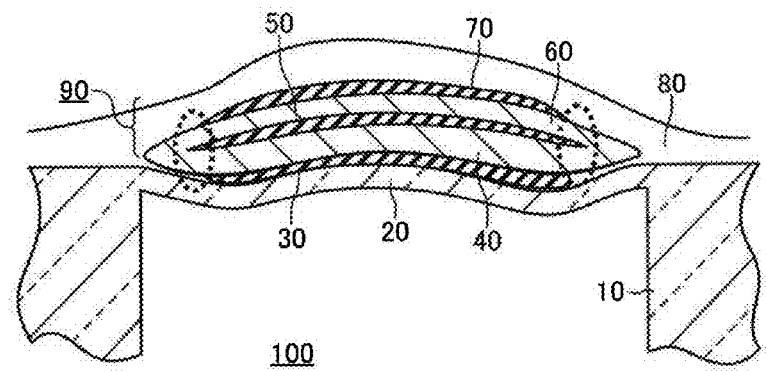
Figure 1:
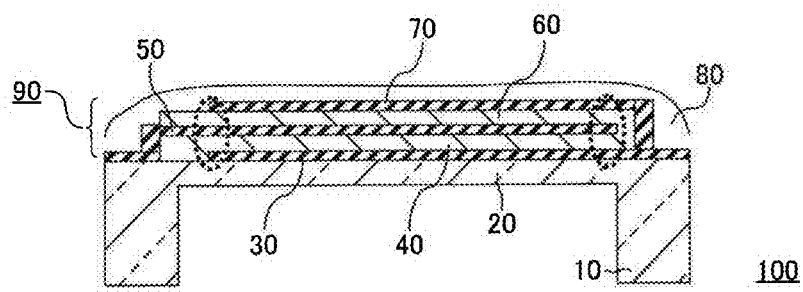

Here, it will be explained, referring to FIG. 1. FIG. 1 is a plan view (a), a sectional view (b) along the line Y shown in the figure, and a sectional view (c) along the line X shown in the figure, of a piezoelectric/electrostrictive actuator according to one embodiment of the present invention, as mentioned above. First, the substrate 10 in which the thickness of the thin-walled part 20 was 6 micrometers was formed by green sheet forming, and was calcinated at 1450 degree Celsius. Next, a platinum (Pt) electrode (lower electrode 30) with a thickness of 1.5 micrometers and a width of 120 micrometers was laminated by screen-printing to the area corresponding to the thin-walled part 20, and was calcinated at 1350 degree Celsius. On this lower electrode 30, the lower layer piezoelectric film 40 with a thickness of 6 micrometers and a width of 160 micrometers was laminated by screen-printing, and a platinum (Pt) electrode (internal electrode 50) with a thickness of 1.5 micrometers and a width of 120 micrometers and the upper piezoelectric film 60 with a thickness of 6 micrometers and a width of 160 micrometers were laminated by screen-printing, and were calcinated at 1250 degree Celsius. Further, on this upper piezoelectric film 60, a gold (Au) electrode (upper electrode 70) with a thickness of 0.2 micrometer and a width of 120 micrometers was laminated by screen-printing, and was calcinated at 800 degree Celsius.

Namely, since the piezoelectric/electrostrictive actuator 100 used in the present example has a configuration wherein the internal electrode 50 is sandwiched by two layers of the piezoelectric film (the lower layer piezoelectric film 40 and the upper layer piezoelectric film 60) and, on its both sides, the lower electrode 30 and the upper electrode 70 are disposed, the piezoelectric/electrostrictive element 90 in the present example will comprise two of the above-mentioned "laminated objects including a piezoelectric/electrostrictive layer and a pair of electrodes arranged respectively on both sides of said piezoelectric/electrostrictive layer". However, the embodiment in which a piezoelectric/electrostrictive element comprises only one laminated object and the embodiment in which a piezoelectric/electrostrictive element comprises three or more of the laminated objects are also contained in the scope of the present invention. In addition, the length of the piezoelectric/electrostrictive actuator 100 in a longitudinal direction (direction perpendicular to the width direction and the thickness direction) was 1000 micrometers.

In addition, as a material of the substrate 10, zirconium dioxide ($ZrO_2$) containing 3 mol % (in metallic elements equivalent) of yttrium oxide ($Y_2O_3$) was used. Moreover, as a material of the piezoelectric films 40 and 60, 0.17 $Pb(Mg_{1/3}Nb_{2/3})O_3$+0.03 $Pb(Ni_{1/3}Nb_{2/3})O_3$+0.80 PZT was used.

In the piezoelectric/electrostrictive actuator 100 used in the present example, the portion of the lower layer piezoelectric film 40 sandwiched by the lower electrode 30 and the internal electrode 50 and the portion of the upper layer piezoelectric film 60 sandwiched by the internal electrode 50 and the upper electrode 70 correspond to an operating part. Namely, these portions will produce the deformation (displacement) in accordance with an applied electric field when the electric field is applied between these electrodes. On the other hand, the portion of the lower layer piezoelectric film 40, which is not sandwiched by the lower electrode 30 and the internal electrode 50, and the portion of the upper layer piezoelectric film 60, which is not sandwiched by the internal electrode 50 and the upper electrode 70 correspond to a non-operating part. Namely, these portions will produce no or little deformation (displacement) in accordance with an applied electric field, even when the electric field is applied between these electrodes. Therefore, as mentioned above, during a polarization treatment or when being driven as a piezoelectric/electrostrictive element, stress tends to be applied to the vicinity of the boundary between an operating part and a non-operating part (portion surrounded by the dotted line in FIG. 1) to generate a microcrack. This microcrack serves as a main factor which causes problems, such as a degradation and an insulation breakdown of a piezoelectric/electrostrictive layer, and a short-circuit of an electrode, and may become a factor which reduces the insulation durability of the piezoelectric/electrostrictive element under high-humidity atmosphere.

Figure 2:
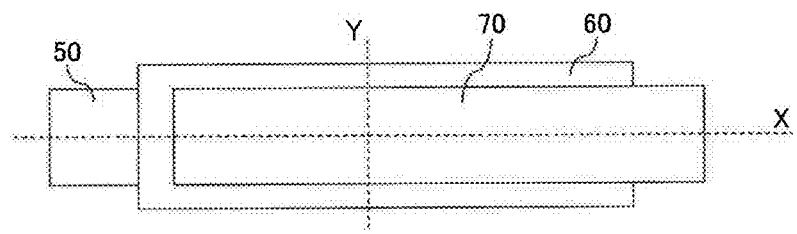
FIG. 2 A plan view (a), a sectional view (b) along the line Y shown in the figure, and a sectional view (c) along the line X shown in the figure, of a piezoelectric/electrostrictive actuator according to another embodiment of the present invention.
Figure 2:
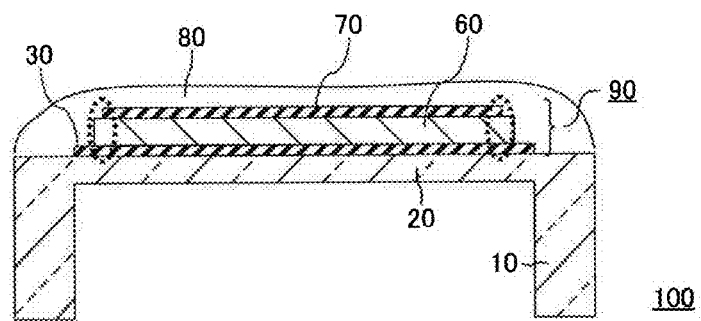
Figure 2:
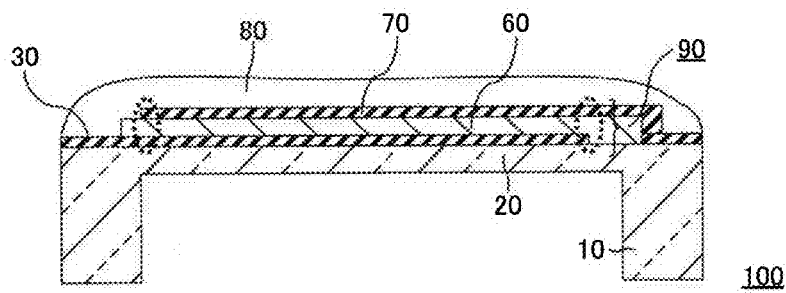

By the way, an example of the embodiment wherein the piezoelectric/electrostrictive element comprises only one laminated object is shown in FIG. 2. FIG. 2 is a plan view (a), a sectional view (b) along the line Y shown in the figure, and a sectional view (c) along the line X shown in the figure, of a piezoelectric/electrostrictive actuator according to another embodiment of the present invention, as mentioned above. In the embodiment shown in FIG. 2, as a material of the substrate 10, zirconium dioxide ($ZrO_2$) containing 3 mol % (in metallic elements equivalent) of yttrium oxide ($Y_2O_3$) was used, and the thickness and width of the thin-walled part 20 were 1.5 micrometers and 100 micrometers, respectively. Moreover, a platinum (Pt) electrode (lower electrode 30) with a thickness of 1.0 micrometer and a width of 90 micrometers was laminated to the area corresponding to this thin-walled part 20. Further, using the ceramics of 0.17 $Pb(Mg_{1/3}Nb_{2/3})O_3$+0.03 $Pb(Ni_{1/3}Nb_{2/3})O_3$+0.80 PZT, the upper layer piezoelectric film 60 with a thickness of 2.5 micrometers and a width of 80 micrometers was laminated on this lower electrode 30. Furthermore, a gold (Au) electrode (upper electrode 70) with a thickness of 0.1 micrometer and a width of 70 micrometers was laminated on this upper layer piezoelectric film 60. Thus, the embodiment wherein a piezoelectric/electrostrictive element contains only one laminated object is also included as a modification of the present invention.

(2) Polarization Treatment of Piezoelectric/Electrostrictive Actuator

The piezoelectric/electrostrictive actuators obtained as mentioned above were subjected to a polarization treatment. Voltage was applied to the electrodes of the piezoelectric/electrostrictive actuators (sintered objects) in which the electrodes were formed as mentioned above. In this case, it is desirable to perform a high temperature polarization treatment which heats the piezoelectric/electrostrictive actuators up to 50 to 150 degree Celsius. When performing the high temperature polarization treatment, an electric field of 2 to 20 kV/mm is applied to the piezoelectric/electrostrictive actuator. In addition, although an electric field of 15 kV/mm was applied to the piezoelectric/electrostrictive actuator 100 at 70 degree Celsius in the present example, the conditions for a polarization treatment can also be properly chosen from various techniques well-known in the art depending on the configuration of the piezoelectric/electrostrictive element 90, etc.

Furthermore, when performing an aging processing, the piezoelectric/the electrostrictive actuator may be heated at 100-300 degree Celsius in the atmosphere in a state where the electrodes are opened.

(3) Coating of Moisture-Proof Film

The moisture-proof film 80 was coated on the outer surface on the side where the laminated object of the piezoelectric film and electrodes (piezoelectric/electrostrictive element 90) is fixed of the piezoelectric/electrostrictive actuator 100 manufactured as mentioned above by a spin coating method. The materials, moisture contents, withstand voltages, and coating thicknesses of each moisture-proof film in the piezoelectric/electrostrictive actuators of Working Examples 1 to 7 and Comparative Examples 1 to 9 are listed in the following Table 1. In addition, as mentioned above, although the moisture-proof film was coated by a spin coating method in the present example, a suitable method can be properly chosen from various coating methods well-known in the art as mentioned above depending on the property of the material of the moisture-proof film and/or the configuration of the piezoelectric/electrostrictive actuator, etc., to be used.

In Table 1, mineral oil A which is a moisture-proof film material in Working Example 1 has a kinetic viscosity of 56 [mm$^2$/s] at 40 degree Celsius, the rates of paraffin carbon, naphthene carbon, and aromatic carbon obtained by the n-d-M method (respectively, % CP, % CN, and % CA), of 66, 34, and 0 respectively, and sulfur content of less than 100 ppm. Moreover, mineral oil B which is a moisture-proof film material in Working Example 2 has a kinetic viscosity of 8.0 [mm$^2$/s] at 40 degree Celsius, % CP, % CN, and % CA), of 54, 38, and 8 respectively, and sulfur content of less than 300 ppm. Further, mineral oil C which is a moisture-proof film material in Working Example 3 has a kinetic viscosity of 8.5 [mm$^2$/s] at 40 degree Celsius, % CP, % CN, and % CA), of 47, 46, and 7 respectively, and sulfur content of less than 100 ppm. In addition, as mentioned above, the n-d-M method (may be referred to as a "n-d-M ring analysis method") is an analytical technique generally used in composition analysis of oil, and is a method for estimating the rates to the total carbon of the paraffin carbon number, naphthene carbon number, and aromatic carbon number in oil from n (refractive index), d (density), M (average molecular weight), and sulfur content concentration.

In addition, in Table 1, polybutene A which is a moisture-proof film material in Working Example 4 has a kinetic viscosity of 110 [mm$^2$/s] at 40 degree Celsius and sulfur content of 100 ppm. Moreover, polybutene B which is a moisture-proof film material in Working Example 5 has a kinetic viscosity of 650 [mm$^2$/s] at 40 degree Celsius and sulfur content of 100 ppm. In addition, the descriptions about the composition and physical properties, etc. of moisture-proof film materials used as representative examples in the present examples are just exemplifications and no more and it should not be interpreted that the moisture-proof film material used in the piezoelectric/electrostrictive actuator according to the present invention is limited to these exemplification. Moreover, it should be kept in mind that the composition ratios and physical-properties value, etc. of the moisture-proof film materials used as representative examples in the present example may be accompanied by a fluctuation to some extent (±about several percent, specifically ±about 5%), for example, due to errors of measurement and/or variations in manufacturing quality of the various materials adopted as the moisture-proof films.

Evaluation of High-Humidity Insulation Degradation

The evaluation method of high-humidity insulation degradation and piezoelectric displacement of various piezoelectric/electrostrictive actuators in the present example will be explained below.

(1) Acceleration Degradation Test

Various piezoelectric/electrostrictive actuators manufactured as mentioned above were driven by applying an electric field of 4 kV/mm with a direct-current for 100 hours under a condition of 40 degree Celsius×85% RH. This acceleration degradation test was conducted on 900 samples for each of the piezoelectric/electrostrictive actuators according to the various working examples and comparative examples listed in Table 1.

(2) Insulation Resistance Measurement

For each of the piezoelectric/electrostrictive actuators according to various working examples and comparative examples, among 900 samples which have passed through the acceleration degradation test, samples with breakage and deterioration in their appearance at the time of the end of acceleration degradation test were excluded, and insulation resistance was measured on the remaining samples. The lowest value among the acquired insulation resistance values is considered as the insulation resistance value after degradation of each piezoelectric/electrostrictive actuator. Namely, it comes to that the higher insulation resistance value after degradation is, the higher insulation durability under high-humidity atmosphere the piezoelectric/electrostrictive actuator has. In addition, the insulation resistance before conducting the acceleration degradation test (before degradation) was 1000 MΩ or more in all piezoelectric/electrostrictive actuators.

(3) Piezoelectric Displacement Measurement

For each of the piezoelectric/electrostrictive actuators according to various working examples and comparative examples after the acceleration degradation test, the amount of displacement in the thickness direction in an electric field of 4 kV/mm was measured by a laser Doppler method, and it was considered as the amount of piezoelectric displacement. When the material coated as the moisture-proof film is hard and inhibits displacement of the piezoelectric/electrostrictive element, the amount of piezoelectric displacement becomes small. Therefore, the larger amount of piezoelectric displacement means smaller inhibition of the piezoelectric displacement by a moisture-proof film, and therefore it is desirable.

(4) Evaluation Results of High-Humidity Insulation Degradation

The measurement results of the piezoelectric displacement and insulation resistance obtained by the above-described procedures are listed in the following Table 1, along with the materials, moisture contents, withstand voltages, and coating thicknesses of the moisture-proof films used in various working examples and comparative examples.

TABLE 1

| | Moisture-Proof Film Material | Saturated Moisture Content [ppm] | Withstand Voltage [kV/mm] | Thickness [μm] | Piezoelectric Displacement [μm] | Insulation Resistance After Degradation [MΩ] |
|---|---|---|---|---|---|---|
| CE1 | None | — | — | — | 0.30 | 0.3 |
| CE2 | Terpineol | 1500 | 1 | 1 | 0.30 | 6 |
| CE3 | Polyolefin | | | 3 | 0.29 | 0.3 |
| CE4 | Polyparaxylylene | | | 1 | 0.27 | 0.05 |
| CE5 | Fluorine Oil | 5 | 8 | 1 | 0.30 | 10 |
| CE6 | Fluorine Gel | 10 | 10 | 3 | 0.30 | 0.8 |
| CE7 | Fluorine Film | | | 3 | 0.29 | 0.05 |
| CE8 | Silicone Series Rubber | | | 3 | 0.28 | 0.3 |
| CE9 | $SiO_2$ Film | | | 0.3 | 0.25 | 0.02 |
| WE1 | Mineral Oil A | 30 | 12 | 1 | 0.30 | 900 |
| WE2 | Mineral Oil B | 40 | 15 | 1 | 0.30 | 700 |
| WE3 | Mineral Oil C | 50 | 10 | 1 | 0.30 | 700 |
| WE4 | Polybutene A | 80 | 8 | 1 | 0.30 | 900 |
| WE5 | Polybutene B | 120 | 7 | 1 | 0.30 | 800 |
| WE6 | Nonane | 50 | 10 | 1 | 0.30 | 900 |
| WE7 | Undecane | 30 | 10 | 1 | 0.30 | 900 |

*[0] CE: Comparative Example, WE: Working Example
*[1] The piezoelectric Displacement and insulation resistance after degradation are the values as the whole actuator.

As shown in Table 1, in the piezoelectric/electrostrictive actuator of Comparative Example 1 as a control in which the moisture-proof film is not coated, although inhibition of the piezoelectric displacement is not observed as a matter of course, the insulation resistance after the acceleration degradation test has fallen remarkably to 0.3 MΩ. It is thought that this is because moisture invaded into the piezoelectric/electrostrictive actuator through the microcrack produced in the vicinity of the boundary between the operating part and the non-operating part by the acceleration degradation test.

Moreover, in the piezoelectric/electrostrictive actuator of Comparative Example 2 in which terpineol which is a kind of monoterpene alcohols is coated as a moisture-proof film, although inhibition of piezoelectric displacement is not observed since the moisture-proof film consisting of a liquid is used, the insulation resistance after the acceleration degradation test has fallen remarkably to 6 MΩ. It is thought that this is because the improvement effect of the insulation durability under high-humidity atmosphere cannot be demonstrated since the saturated moisture content of terpineol is high at 1500 ppm and its withstand voltage is low at 1 kV/mm.

Further, in all of the piezoelectric/electrostrictive actuators of Comparative Examples 3, 4 and 7 to 9 in which polyolefin, polyparaxylene, fluorine membrane, silicone series rubber, and silicon dioxide ($SiO_2$) is respectively adopted as a moisture-proof film, inhibition of piezoelectric displacement is observed as compared with the piezoelectric/electrostrictive actuator of Comparative Example 1 as a control in which a moisture-proof film is not coated. This indicates that the moisture-proof films adopted in these piezoelectric/electrostrictive actuators are hard, and become an inhibition factor of piezoelectric displacement.

Moreover, in these piezoelectric/electrostrictive actuators, the insulation resistance after the acceleration degradation test has also fallen remarkably. This indicates that high-humidity insulation degradation could not sufficiently suppressed since the moisture-proof films adopted in these piezoelectric/electrostrictive actuators lack flowability and therefore the microcrack newly generated in the vicinity of the boundary between an operating part and a non-operating part during the acceleration degradation test could not be sufficiently filled up with the material of the moisture-proof film, or the state where the moisture-proof film is sufficiently stuck to the surface of the piezoelectric/electrostrictive actuator could not be maintained.

On the other hand, in the piezoelectric/electrostrictive actuators of Comparative Examples 5 and 6 in which fluorine oil and fluorine gel with relatively high flowability are respectively adopted as a moisture-proof film, inhibition of piezoelectric displacement is not observed. Moreover, fluorine oil and fluorine gel have low saturated moisture contents of 5 ppm and 10 ppm, respectively. Moreover, although the withstand voltages of fluorine oil and fluorine gel are high at 8 kV/mm and 10 kV/mm respectively, the improvement effect of the insulation durability under high-humidity atmosphere cannot be demonstrated, and the insulation resistances after the acceleration degradation test has also fallen remarkably to 10 kV/mm and 0.8 kV/mm respectively.

As mentioned above, although both saturated moisture contents and withstand voltages of fluorine oil and fluorine gel are in the range suitable as a material of the moisture-proof film of the piezoelectric/electrostrictive actuator according to the present invention, they could not demonstrate the improvement effect of the insulation durability under high-humidity atmosphere. It is thought that fluorine oil and fluorine gel are not a liquid which contains, as a main component, hydrocarbon system organic compound having a main backbone of carbon-carbon bond and consisting only of carbon and hydrogen and, therefore, could not demonstrate desired insulation durability under high-humidity atmosphere, as a moisture-proof film in a piezoelectric/electrostrictive actuator.

On the other hand, in the piezoelectric/electrostrictive actuators of Working Examples 1 to 7 in which mineral oil A to C, polybutene A and B, nonane, and undecane (these are liquids which have saturated moisture contents and withstand voltages in the range suitable as a material of the moisture-proof film of the piezoelectric/electrostrictive actuator according to the present invention, and which contain, as a main component, hydrocarbon system organic compound having a main backbone of carbon-carbon bond and consisting only of carbon and hydrogen), are adopted respectively as a moisture-proof film, high insulation resistance comparable to that before the acceleration degradation test have been maintained without inhibition of piezoelectric displacement. This indicates that the high-humidity insulation degradation could be sufficiently suppressed since the microcrack newly generated in the vicinity of the boundary between an operating part and a non-operating part during the acceleration degradation test is sufficiently filled up with the material of the moisture-proof film and the state where the moisture-proof film is sufficiently stuck to the surface of the piezoelectric/electrostrictive actuator could be maintained (no exfoliation).

Example 2

In the examples that will be described below, some embodiments of the present invention and comparative examples, in a case where it is intended to attain still higher high-humidity insulation durability, such as retention of high insulation resistance even after acceleration degradation test under severer conditions, similarly to the piezoelectric/electrostrictive actuator according to the above-mentioned third embodiment of the present invention, will be explained.

Manufacture of Piezoelectric/Electrostrictive Actuator

Manufacture of the piezoelectric/electrostrictive actuator according to Working Examples 11 to 17 of the present invention and Comparative Examples 11 to 16 will be explained below. However, the configuration and the production method, etc. which will be explained below are just exemplifications and no more and the configuration and the production method of the piezoelectric/electrostrictive actuator according to the present invention are not limited thereto.

(1) Manufacture and Polarization Treatment of Piezoelectric/Electrostrictive Actuator The piezoelectric/electrostrictive actuators according to Working Examples 11 to 17 of the present invention and Comparative Examples 11 to 16 were manufactured and subjected to the polarization treatment similarly to the above-mentioned piezoelectric/electrostrictive actuators according to Working Examples 1 to 7 of the present invention and Comparative Examples 1 to 9.

(2) Measurement of Transfer Coefficient of Moisture-Proof Film Material

As mentioned above, the transfer coefficient ($k_L$) of moisture in the liquid boundary film of the liquid material which constitutes the moisture-proof film can be calculated from the slope (($S/V$)×$k_L$) of plots obtained by measuring the concentration of moisture in the liquid in a state where a predetermined volume (V) of the liquid contacts with its ambient atmosphere through a predetermined surface area (S), under a predetermined circumstance (40 degree Celsius×85% RH), for example, by a detection means, such as a commercial moisture-in-oil meter (for example, HUMICAP (registered trademark) MMT162, manufactured by VAISALA), computing the values of $-\ln(1-X)$ from such measurement results, and plotting the same to time (t). In addition, as mentioned above, X expresses the ratio of the concentration (Cw) of the water dissolved in the liquid to the saturation concentration ($Cw_S$) of the water dissolved in the liquid (may be referred to as an "activity value").

Figure 5:
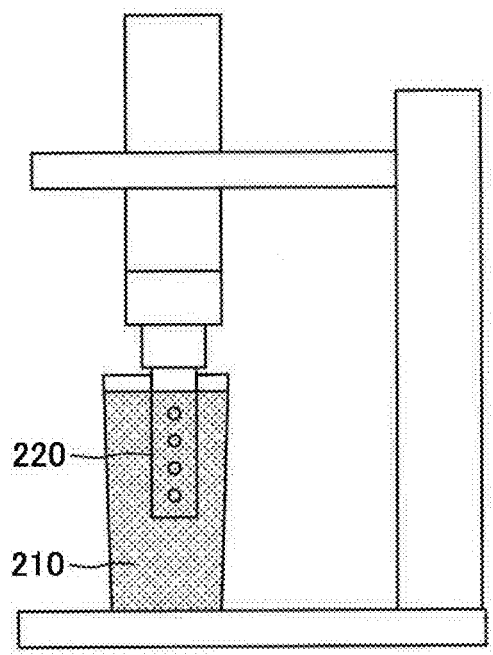
FIG. 5 A schematic diagram showing an outline of a measuring apparatus used for measurement of a transfer coefficient ($k_L$) of moisture in a liquid boundary film of liquid material which constitutes a moisture-proof film.

Here, a measuring apparatus used for measurement of the transfer coefficient ($k_L$) of moisture in the liquid boundary film of the liquid material which constitutes various moisture-proof films will be explained referring to accompanying drawings. FIG. 5 is a schematic diagram showing an outline of a measuring apparatus used for measurement of a transfer coefficient ($k_L$) of moisture in a liquid boundary film of liquid material which constitutes a moisture-proof film, as mentioned above. In the measuring apparatus shown in FIG. 5, a predetermined quantity (for example, 25 mL) of the liquid 210 which constitutes a moisture-proof film is retained in a container which has a predetermined volume (for example, 30 mmφ×50 mmH), and the moisture detection means 220 is disposed so that it may be immersed into the liquid. The measuring apparatus which has such a configuration had been stood still for 24 hours under the circumstance of 40 degree Celsius×55% RH, and the change of moisture concentration (Cw) based on the detection signal from the moisture detection means 220 was recorded periodically (for example, at intervals of 10 minutes). In addition, in the present example, as the moisture detection means 220, a moisture-in-oil meter, HUMICAP (registered trademark) MMT162, manufactured by VAISALA was used.

Figure 6:
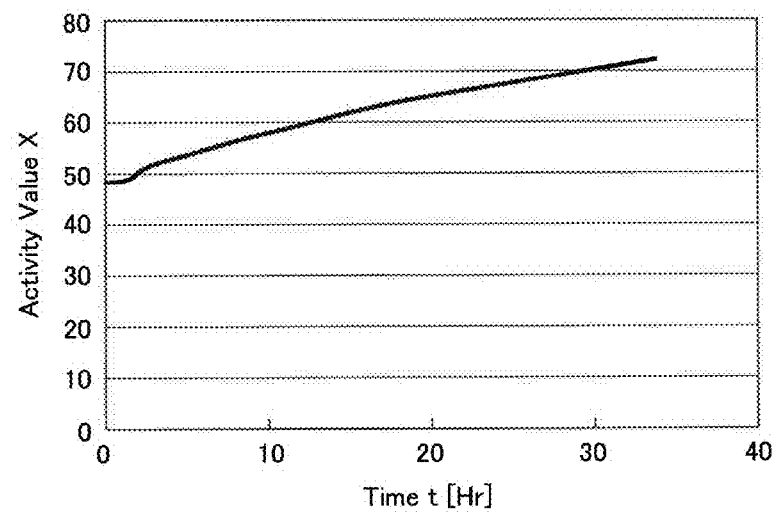
FIG. 6 A graph showing plots of activity value (X) to time (t) in a moisture-proof film material according to one embodiment of the present invention.

An example of the graph in which the proportions of the moisture concentration (Cw) obtained as mentioned above to the saturated moisture concentration ($Cw_S$) computed as activity value (X) are plotted to time (t) is shown in FIG. 6. As mentioned above, FIG. 6 is a graph showing plots of activity value (X) to time (t) in a moisture-proof film material according to one embodiment of the present invention. Moreover, an example of the graph in which $-\ln(1-X)$ computed from the activity value (X) as mentioned above is plotted to time (t) is shown in FIG. 7. As mentioned above, FIG. 7 is a graph showing plots of $-\ln(1-X)$ to the time (t) in a moisture-proof film material according to one embodiment of invention.

Figure 7:
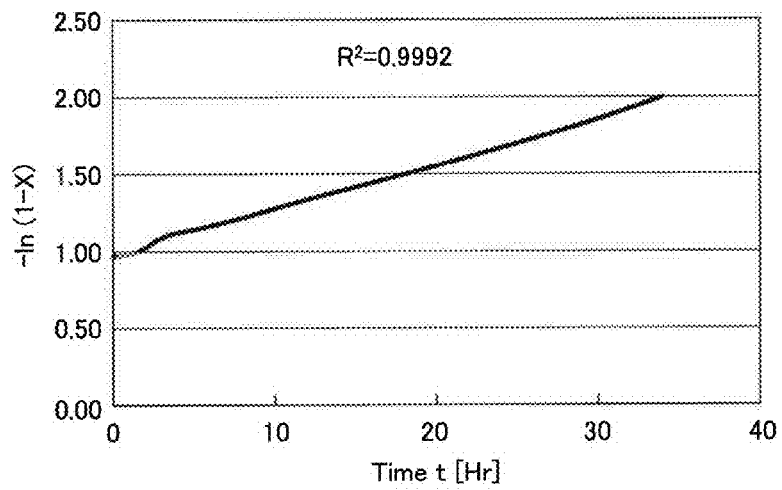
FIG. 7 A graph showing plots of −ln (1−X) to the time (t) in a moisture-proof film material according to one embodiment of invention.

As mentioned above, the slope of the graph shown in FIG. 7 corresponds to ($S/V$)×$k_L$. Therefore, the transfer coefficient ($k_L$) of moisture in the liquid boundary film of the liquid which constitutes various moisture-proof films was computed by assigning the above-mentioned S and V to the value of the slope. In addition, in a graph as shown in FIG. 7, there is a high possibility that moisture in the liquid 210 may not yet have reached to the moisture detection means 220 in the early period of measurement. On the other hand, since the concentration (Cw) of moisture in the liquid 210 may approach the saturated moisture concentration ($Cw_S$) at the end of measurement, it deviates from diffusion-limited access. Therefore, when obtaining the slope of the graph, the data in the early period and end of measurement was excluded so that the coefficient of determination R2 might become 0.99 or more.

(3) Coating of Moisture-Proof Film

Similarly to the above-mentioned piezoelectric/electrostrictive actuators according to Working Examples 1 to 7 of the present invention and Comparative Examples 1 to 9, the moisture-proof film was coated on the outer surface on the side where the laminated object of the piezoelectric film and electrodes (piezoelectric/electrostrictive element) is fixed of the piezoelectric/electrostrictive actuator manufactured as mentioned above by a spin coating method. The materials, moisture contents, withstand voltages, and coating thicknesses of each moisture-proof film in the piezoelectric/electrostrictive actuators of Working Examples 1 to 7 and Comparative Examples 1 to 9 are listed in the following Table 2. In addition, as mentioned above, although the moisture-proof film was coated by a spin coating method in the present example, a suitable method can be properly chosen from various coating methods well-known in the art as mentioned above depending on the property of the material of the moisture-proof film and/or the configuration of the piezoelectric/electrostrictive actuator, etc., to be used.

As shown in Table 2, in the moisture-proof film materials according to Working Examples 11 to 17, the ratio of the naphthene carbon rate (% CN) to the sum of the paraffin carbon rate (% CP) and the naphthene carbon rate (% CN) acquired by the n-d-M method (naphthene ratio) is not less than 20% and it is less than 40%, and the aromatic carbon rate (% CA) is less than 2%, the transfer coefficient of moisture in the liquid boundary film of the above-mentioned liquid under the circumstance of 40 degree Celsius×85% RH is less than 0.2 cm/Hr, and sulfur content is less than 100 ppm. Namely, in the moisture-proof film materials according to these working examples, all these items fall within the desirable range.

On the other hand, in the moisture-proof film materials according to Comparative Examples 11 and 12, the naphthene ratio obtained by the n-d-M method is not less than 40%, the aromatic carbon rate (% CA) is not less than 2%, the transfer coefficient of moisture is 0.2 cm/Hr or more, and sulfur content is not less than 100 ppm. Namely, in the moisture-proof film materials according to Comparative Examples 11 and 12, all these items deviates from the desirable range. Moreover, in the moisture-proof film materials according to Comparative Examples 13 to 16, although the aromatic carbon rate (% CA) and sulfur content have fallen within the desirable range, other items (the naphthene ratio and the transfer coefficient) have deviated from the desirable range.

Evaluation of High-Humidity Insulation Degradation

The evaluation method of high-humidity insulation degradation of various piezoelectric/electrostrictive actuators in the present example will be explained below.

(1) Acceleration Degradation Test

Each of the various piezoelectric/electrostrictive actuators manufactured as mentioned above was driven by applying an electric field with a direct-current for 100 hours under a condition of 40 degree Celsius×85% RH. On this occasion, an electric field of 8 kV/mm was applied for the piezoelectric/electrostrictive actuators according to Working Examples 11 to 17 of the present invention and Comparative Examples 11 to 16, while an electric field of 4 kV/mm was applied for the piezoelectric/electrostrictive actuators according to the above-mentioned Working Examples 1 to 7 of the present invention and Comparative Examples 1 to 9. This acceleration degradation test was conducted on 900 samples for each of the piezoelectric/electrostrictive actuators according to the various working examples and comparative examples listed in Table 2.

(2) Insulation Resistance Measurement

Similarly to the piezoelectric/electrostrictive actuators according to the above-mentioned Working Examples 1 to 7 of the present invention and Comparative Examples 1 to 9, for each of the piezoelectric/electrostrictive actuators according to various working examples and comparative examples, among 900 samples which have passed through the acceleration degradation test, samples with breakage and deterioration in their appearance at the time of the end of acceleration degradation test were excluded, and insulation resistance was measured on the remaining samples. The lowest value among the acquired insulation resistance values is considered as the insulation resistance value after degradation of each piezoelectric/electrostrictive actuator. Namely, it comes to that the higher insulation resistance value after degradation is, the higher insulation durability under high-humidity atmosphere the piezoelectric/electrostrictive actuator has. In addition, the insulation resistance before conducting the acceleration degradation test (before degradation) was 1000 MΩ or more in all piezoelectric/electrostrictive actuators.

(3) Evaluation Results of High-Humidity Insulation Degradation

The measurement results of the insulation resistance obtained by the above-described procedures are listed in the following Table 2, along with the materials, compositions, moisture contents, and transfer coefficients of the moisture-proof films used in various working examples and comparative examples.

TABLE 2

| | Moisture-Proof Film Material | % CP | % CN | % CA | Naphthene Ratio [%] | Sulfur [ppm] | Saturated Moisture Content [ppm] | Transfer Coefficient [cm/Hr] | Insulation Resistance After Degradation [MΩ] |
|---|---|---|---|---|---|---|---|---|---|
| CE11 | Mineral Oil B | 53.5 | 38.0 | 8.5 | 41.5 | 280 | 65 | 0.299 | 372 |
| CE12 | Mineral Oil C | 47.1 | 45.8 | 7.0 | 49.3 | 120 | 50 | 0.693 | 80 |
| WE11 | Mineral Oil D | 66.3 | 33.7 | 0.0 | 33.7 | <100 | 41 | 0.133 | 800 |
| WE12 | Mineral Oil A | 66.5 | 33.5 | 0.0 | 33.5 | <100 | 34 | 0.103 | 900 |
| WE13 | Mineral Oil F | 70.2 | 29.6 | 0.2 | 29.7 | <100 | 43 | 0.090 | 900 |
| WE14 | Mineral Oil G | 68.5 | 31.4 | 0.1 | 31.4 | <100 | 37 | 0.091 | 900 |
| CE13 | Mineral Oil H | 91.8 | 7.7 | 0.5 | 7.7 | <100 | 36 | 0.294 | 400 |
| CE14 | Mineral Oil I | 96.4 | 3.6 | 0.0 | 3.6 | <100 | 25 | 0.558 | 80 |
| WE15 | Mineral Oil J | 78.3 | 21.7 | 0.0 | 21.7 | <100 | 31 | 0.171 | 800 |

TABLE 2-continued

| | Moisture-Proof Film Material | % CP | % CN | % CA | Naphthene Ratio [%] | Sulfur [ppm] | Saturated Moisture Content [ppm] | Transfer Coefficient [cm/Hr] | Insulation Resistance After Degradation [MΩ] |
|---|---|---|---|---|---|---|---|---|---|
| WE16 | Mineral Oil K | 68.2 | 31.8 | 0.0 | 31.8 | <100 | <20 | 0.095 | 800 |
| WE17 | Mineral Oil L | 60.2 | 38.4 | 1.1 | 38.8 | <100 | 25 | 0.094 | 800 |
| CE15 | Mineral Oil M | 51.6 | 48.2 | 0.2 | 48.3 | <100 | 33 | 0.542 | 100 |
| CE16 | Undecane | 100 | 0 | 0 | 0 | <100 | — | 0.943 | 30 |

[0] CE: Comparative Example, WE: Working Example
[1] The values of insulation resistance after degradation (8 kV/mm) is the values as the whole actuator.

As shown in Table 2, in the piezoelectric/electrostrictive actuators according to Comparative Examples 11 and 12 in which all of the naphthene ratio of the moisture-proof film material, the aromatic carbon rate (% CA), the transfer coefficients of moisture, and the sulfur content have deviated from the desirable range, the insulation resistances after the acceleration degradation test have fallen remarkably to 372 MΩ and 80 MΩ, respectively. The piezoelectric/electrostrictive actuators according to these comparative examples correspond to the piezoelectric/electrostrictive actuator according to the above-mentioned Working Examples 2 and 3, respectively. However, although they could retain good insulation resistances after the acceleration degradation test under a relatively mild condition (specifically, an electric field of 4 kV/mm), they could not retain good insulation resistances after the acceleration degradation test under a severer condition (specifically, an electric field of 8 kV/mm).

Similarly, in the piezoelectric/electrostrictive actuators according to Comparative Examples 13 to 16, although the aromatic carbon rate (% CA) and sulfur content have fallen with the desirable range, other items (the naphthene ratio and transfer coefficient) have deviated from the desirable range. Therefore, after the acceleration degradation test under a severer condition (specifically, an electric field of 8 kV/mm), good insulation resistance could not be retained. In addition, the piezoelectric/electrostrictive actuator according Comparative Example 16 corresponds to the piezoelectric/electrostrictive actuator according to the above-mentioned Working Example 7. However, although good insulation resistance could be retained after the acceleration degradation test under a relatively mild condition (specifically, an electric field of 4 kV/mm), good insulation resistance could not be retained after the acceleration degradation test under a severer condition (specifically, an electric field of 8 kV/mm).

On the other hand, in the piezoelectric/electrostrictive actuators according to Working Examples 11 to 17, in which all of the naphthene ratio of moisture-proof film material, the aromatic carbon rate (% CA), the transfer coefficients of moisture, and the sulfur content have fallen within the desirable range, even after the acceleration degradation test under a severer condition (specifically, an electric field of 8 kV/mm), good insulation resistance could be retained.

Figure 8:
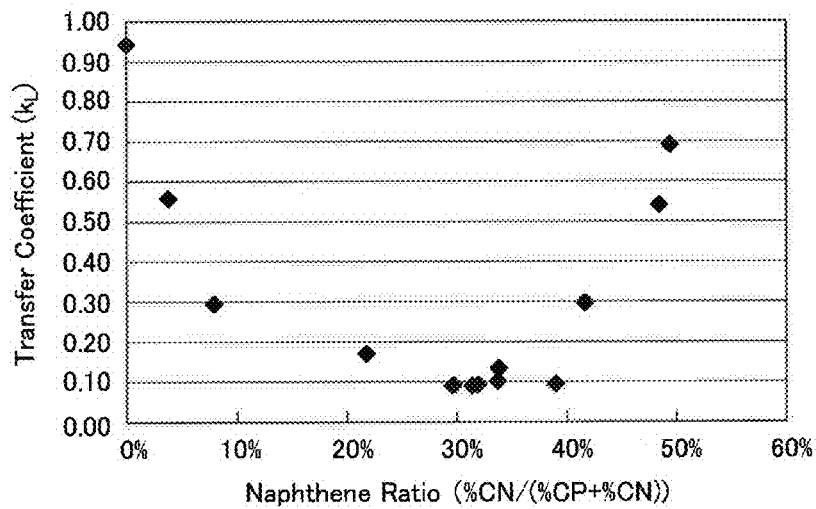
FIG. 8 A graph showing plots of transfer coefficient to naphthene ratio about each of piezoelectric/electrostrictive actuators according to various working examples and comparative examples.
Figure 9:
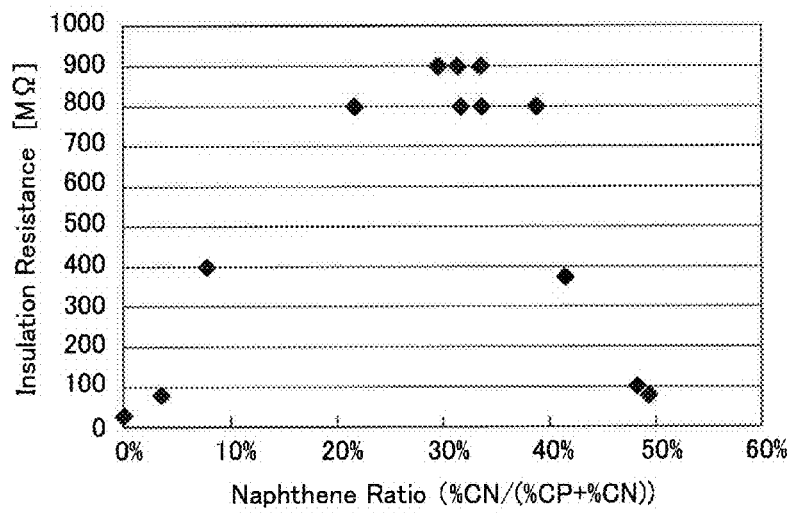
FIG. 9 A graph showing plots of insulation resistance after degradation to naphthene ratio about each of piezoelectric/electrostrictive actuators according to various working examples and comparative examples.

Here, graphs showing the plots of transfer coefficient to naphthene ratio and the plots of insulation resistance after degradation to naphthene ratio about each of piezoelectric/electrostrictive actuators according to various working examples and comparative examples are shown in FIG. 8 and FIG. 9, respectively. As apparent from the graph shown in FIG. 8, it turns out that liquid whose naphthene ratio is not less than 20% and less than 40% can retain the transfer coefficient of moisture in the liquid boundary film of the liquid which constitutes the moisture-proof film of less than 0.2 cm/Hr. Moreover, as apparent from the graph shown in FIG. 9, it turns out that liquid whose naphthene ratio is not less than 20% and less than 40% and which presented the transfer coefficient of less than 0.2 in the graph shown in FIG. 8 can retain a good insulation resistance even after the acceleration degradation test under severer condition (specifically, an electric field of 8 kV/mm). Namely, as mentioned above, it has been confirmed that the piezoelectric/electrostrictive actuator which can retain a good insulation resistance even after the acceleration degradation test under severer condition (specifically, an electric field of 8 kV/mm) can be provided by making the transfer coefficient of moisture in the liquid boundary film of the liquid which constitutes the moisture-proof film under the circumstance of 40 degree Celsius×85% RH be less than 0.2 cm/Hr.

Figure 10:
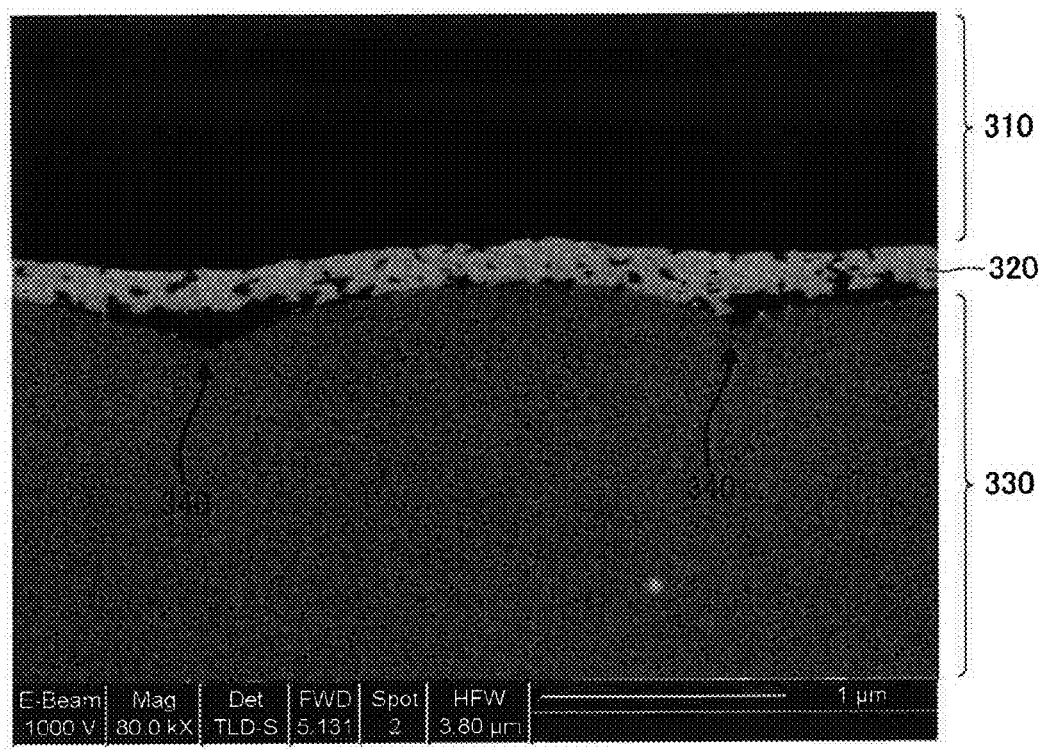
FIG. 10 A scanning electron microscope (SEM) photograph of a section of a piezoelectric/electrostrictive actuator according to Working Example 12.

Moreover, the cross-sectional sample of the piezoelectric/electrostrictive actuator according to Working Example 12 was made by convergence ion beam (FIB) processing in a freeze state, and the coating state of the moisture-proof film was observed with a scanning electron microscope (SEM). The result is shown in FIG. 10. In the SEM photograph shown in FIG. 10, it can be confirmed that a crevice exists between the grain boundary 340 in the piezoelectric film 330 and the upper electrode (Au) 320, and that the crevice is filled up with the moisture-proof film 310. Thereby, moisture can be prevented from invading into the piezoelectric/electrostrictive element through the crevice, and a high-humidity insulation degradation (fall of the insulation property of the piezoelectric/electrostrictive element under a high-humidity atmosphere) can be suppressed.

INDUSTRIAL AVAILABILITY

As mentioned above, in accordance with the present invention, a piezoelectric/electrostrictive actuator which presents excellent insulation durability even under a high-humidity atmosphere while suppressing inhibition of piezoelectric displacement is provided.

REFERENCE SIGNS LIST

10: Substrate, 20: Thin-walled Part, 30: Lower Electrode, 40: Lower layer Piezoelectric Film, 50: Internal Electrode, 60: Upper Layer Piezoelectric Film, 70: Upper Electrode, 80: Moisture-proof Film, 90: Piezoelectric/electrostrictive Element, 100: Piezoelectric/electrostrictive Actuator, 110: Grain Boundary, 120: Crack Produced in Grain Boundary, 210: Moisture-proof Film Material, 220: Moisture Detection Means (Moisture-in-oil Meter), 310: Moisture-proof Film, 320: Upper Electrode (Au), 330: Piezoelectric Film, and 340: Grain Boundary.

The invention claimed is:

1. A piezoelectric/clectrostrictive actuator which comprises:
   a piezoelectric/electrostrictive element comprising at least one laminated object including a piezoelectric/electrostrictive layer and a pair of electrodes arranged respectively on both sides of said piezoelectric/electrostrictive layer, and having an operating part corresponding to the portion in which said piezoelectric/electrostrictive layer is sandwiched in between said pair of electrodes and a non-operating part corresponding to the portion in which said piezoelectric/electrostrictive layer is not sandwiched in between said pair of electrodes, and
   a moisture-proof film arranged so as to cover at least the vicinity of a boundary between said operating part and said non-operating part, consisting of a liquid with a saturated moisture content at 25 degree Celsius of 300 ppm or less and a withstand voltage at the saturated moisture content of not less than 6 kV/mm, and said liquid contains, as a main component, hydrocarbon system organic compound having a main backbone of carbon-carbon bond and consisting only of carbon and hydrogen.

2. The piezoelectric/electrostrictive actuator according to claim 1, wherein:
   moisture content of said liquid in a state where said liquid is used as said moisture-proof film is not less than 20 ppm.

3. The piezoelectric/electrostrictive actuator according to claim 1, wherein:
   a transfer coefficient of moisture in a liquid boundary film of said liquid under a circumstance of 40 degree Celsius×85% RH is less than 0.2 cm/Hr.

4. The piezoelectric/electrostrictive actuator according to claim 3, wherein:
   paraffin carbon rate (% CP), naphthene carbon rate (% CN), and aromatic carbon rate (% CA) obtained by the n-d-M method satisfy the relation expressed by the following formula (1).

[Formula 1]

$$20\% \leq \frac{\% \, CN}{\% \, CP + \% \, CN} < 40\%, \, \% \, CA < 2\%. \quad (1)$$

5. The piezoelectric/electrostrictive actuator according to claim 4, wherein:
   sulfur content is less than 100 ppm.

6. The piezoelectric/electrostrictive actuator according to claim 1, wherein:
   said liquid further comprises less than 5 mass % of a gelling agent.

7. The piezoelectric/electrostrictive actuator according to claim 6, wherein:
   said gelling agent is a gelling agent originating in vegetable oil.

8. The piezoelectric/electrostrictive actuator according to claim 1, wherein:
   said piezoelectric/electrostrictive element is arranged on a substrate.

9. The piezoelectric/electrostrictive actuator according to claim 8, wherein:
   said substrate has a thin-walled part, and said piezoelectric/electrostrictive element is arranged so as to cover at least one portion of the thin-walled part.

10. The piezoelectric/electrostrictive actuator according to claim 9, wherein:
    said piezoelectric/electrostrictive element is fixed to an area corresponding to said thin-walled part on said substrate.

11. The piezoelectric/electrostrictive actuator according to claim 8, wherein:
    said piezoelectric/electrostrictive element is fixed to said substrate through said electrode.

12. The piezoelectric/electrostrictive actuator according to claim 1, wherein:
    said moisture-proof film is arranged so as to cover the vicinity of a boundary between said operating part and said non-operating part as well as said operating part,
    said piezoelectric/electrostrictive actuator has a minute crack in the vicinity of a boundary between said operating part and said non-operating part, or in the vicinity of a grain boundary between crystal grains which constitutes the piezoelectric/electrostrictive layer included in said operating part, in said piezoelectric/electrostrictive element, and
    the crack is filled up with said liquid which constitutes said moisture-proof film.

13. The piezoelectric/electrostrictive actuator according to claim 1, wherein:
    at least one layer of protective film is further arranged on said moisture-proof film.

14. The piezoelectric/electrostrictive actuator according to claim 13, wherein:
    at least one layer among said protective films comprises fluorine system organic material.

15. The piezoelectric/electrostrictive actuator according to claim 13, wherein:
    at least one layer among said protective films is formed by hardening the surface of said moisture-proof film.

16. The piezoelectric/electrostrictive actuator according to claim 13, wherein:
    at least one layer among said protective films comprises polyparaxylylcne system organic material.

* * * * *